US012751012B2

(12) United States Patent
Fukuzumi et al.

(10) Patent No.: US 12,751,012 B2
(45) Date of Patent: Sep. 29, 2026

(54) MEMORY DEVICES AND RELATED ELECTRONIC SYSTEMS

(71) Applicant: Micron Technology, Inc., Boise, ID (US)

(72) Inventors: Yoshiaki Fukuzumi, Yokohama (JP); Jun Fujiki, Tokyo (JP); Matthew J. King, Boise, ID (US); Sidhartha Gupta, Boise, ID (US); Paolo Tessariol, Arcore (IT); Kunal Shrotri, Boise, ID (US); Kye Hyun Baek, Boise, ID (US); Kyle A. Ritter, Boise, ID (US); Shuji Tanaka, Tokyo (JP); Umberto Maria Meotto, Dietlikon (CH); Richard J. Hill, Boise, ID (US); Matthew Holland, Victor, NY (US)

(73) Assignee: Micron Technology, Inc., Boise, ID (US)

( * ) Notice: Subject to any disclaimer, the term of this patent is extended or adjusted under 35 U.S.C. 154(b) by 130 days.

(21) Appl. No.: 18/525,652

(22) Filed: Nov. 30, 2023

(65) Prior Publication Data

US 2024/0099007 A1 Mar. 21, 2024

Related U.S. Application Data

(63) Continuation of application No. 17/127,971, filed on Dec. 18, 2020, now Pat. No. 11,903,196.

(51) Int. Cl.
*H10B 43/30* (2023.01)
*H10B 41/27* (2023.01)
*H10B 43/27* (2023.01)

(52) U.S. Cl.
CPC ............. *H10B 43/27* (2023.02); *H10B 41/27* (2023.02)

(58) Field of Classification Search
None
See application file for complete search history.

(56) References Cited

U.S. PATENT DOCUMENTS 11,362,142 B2 6/2022 Hu
2014/0217488 A1* 8/2014 Thimmegowda ...... H10B 41/27 257/314

(Continued)

FOREIGN PATENT DOCUMENTS

CN 111048514 A 4/2020
CN 111725227 A 9/2020

OTHER PUBLICATIONS

Chinese First Office Action and Search Report for Chinese Application No. 202111548304.8, dated Sep. 5, 2025, 25 pages with translation.

*Primary Examiner* — Sarah K Salerno
(74) *Attorney, Agent, or Firm* — TraskBritt

(57) ABSTRACT

A microelectronic device comprises a stack structure comprising a stack structure comprising a vertically alternating sequence of conductive structures and insulative structures arranged in tiers, the stack structure divided into block structures separated from one another by slot structures, strings of memory cells vertically extending through the block structures of the stack structure, the strings of memory cells individually comprising a channel material vertically extending through the stack structure, an additional stack structure vertically overlying the stack structure and comprising a vertical sequence of additional conductive structures and additional insulative structures arranged in additional tiers, first pillars extending through the additional stack structure and vertically overlying the strings of memory cells, each of the first pillars horizontally offset from a center of a corresponding string of memory cells, second pillars extending through the additional stack struc- (Continued)

ture and vertically overlying the strings of memory cells, and additional slot structures comprising a dielectric material extending through at least a portion of the additional stack structure and sub-dividing each of the block structures into sub-block structures, the additional slot structures horizontally neighboring the first pillars. Related microelectronic devices, electronic systems, and methods are also described.

20 Claims, 19 Drawing Sheets

(56) References Cited

U.S. PATENT DOCUMENTS

| | | | | |
|---|---|---|---|---|
| 2015/0076580 | A1* | 3/2015 | Pachamuthu | H10B 41/20<br>257/314 |
| 2016/0043100 | A1 | 2/2016 | Lee et al. | |
| 2020/0286910 | A1 | 9/2020 | Kashima | |
| 2020/0303402 | A1 | 9/2020 | Kobayashi et al. | |
| 2021/0028189 | A1 | 1/2021 | Mitsuno et al. | |
| 2021/0358806 | A1 | 11/2021 | Hu et al. | |
| 2021/0358890 | A1* | 11/2021 | Hu | H10B 63/84 |
| 2022/0068955 | A1* | 3/2022 | King | H10B 41/10 |
| 2022/0232621 | A1* | 7/2022 | Jang | H04W 74/006 |
| 2022/0262821 | A1* | 8/2022 | Bicksler | H10B 41/10 |
| 2022/0319601 | A1* | 10/2022 | Kang | H10B 43/27 |

* cited by examiner

MEMORY DEVICES AND RELATED ELECTRONIC SYSTEMS

CROSS-REFERENCE TO RELATED APPLICATION

This application is a continuation of U.S. patent application Ser. No. 17/127,971, filed Dec. 18, 2020, now U.S. Pat. No. 11,903,196, issued Feb. 13, 2024, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices, and related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the number of tiers of the conductive structures increases, processing conditions of the formation of aligned contacts to various components of the microelectronic device becomes increasingly difficult. In addition, other technologies to increase memory density have reduced the spacing between adjacent vertical memory strings. However, reducing the spacing between adjacent vertical memory strings may increase a difficulty of forming various isolation structures between the vertical memory strings.

DETAILED DESCRIPTION

Figure 1A:
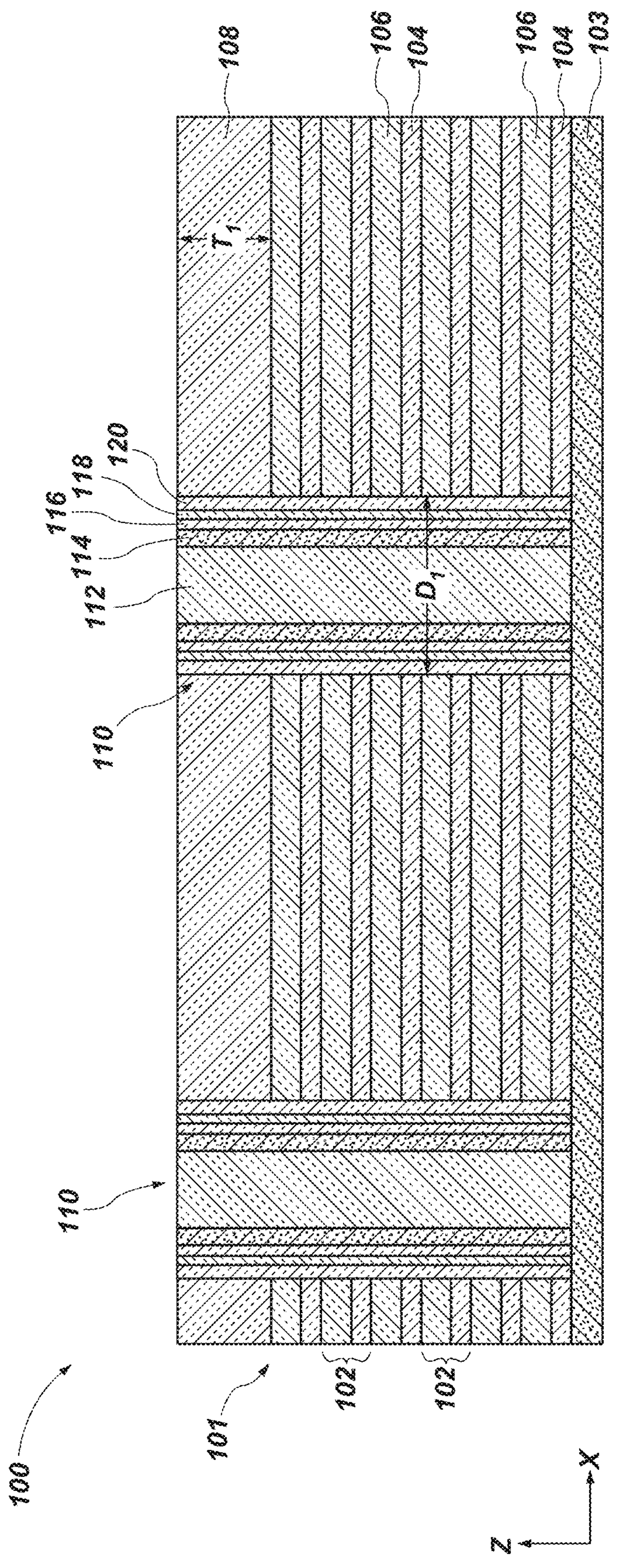
FIG. 1A through FIG. 1P are simplified cross-sectional views (FIG. 1A, FIG. 1C, FIG. 1D, FIG. 1F through FIG. 1J, FIG. 1L, FIG. 1M, FIG. 1O, and FIG. 1P) and top-down views (FIG. 1B, FIG. 1E, FIG. 1K, and FIG. 1N) illustrating a method of forming a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material, such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device comprises a stack structure comprising alternating conductive structures and insulative structures arranged in tiers, each tier comprising a conductive structure and an insulative structure. Strings of memory cells extend through the stack structure and may comprise, for example, a channel material extending through the stack structure as part of pillar structures. The strings of memory cells may be arranged in rows and columns. Memory cells of the strings of memory cells may be located at intersections between the conductive structures and the pillar structures including the channel material, adjacent memory cells of each string being separated from each other by one of the insulative structures. In some embodiments, the strings may include strings that are horizontally (e.g., laterally) aligned with each other and at least other strings that are horizontally offset from each other.

Another stack structure may vertically overlie the stack structure and may include additional conductive structures and additional insulative structures arranged in tiers. The microelectronic device may be separated into one or more block structures by slots filled with a dielectric material. Each of the block structures may be separated into one or more sub-block structures by additional slots extending through at least a portion of the other stack structure. Pillars extend through the other stack structure and vertically overlie the strings of memory cells. The pillars may include a channel material electrically coupled to the channel material of the strings of memory cells. The pillars that neighbor (e.g., are located adjacent to) the additional slots may be horizontally offset from a center of an underlying string of memory cells in a direction away from the additional slots. Thus, a center of the pillars neighboring the (e.g., adjacent to) additional slots may be horizontally farther from the horizontal boundaries of the additional slots than the center of the underlying strings of memory cells. Pillars that are spaced from the additional slots by other pillars may be substantially concentric with underlying strings of memory cells. Accordingly, the pillars may include a first group of pillars that are horizontally offset from a center of a directly underlying string of memory cells and a second group of pillars that are aligned with (e.g., concentric with) a directly underlying string of memory cells or horizontally offset from a center of an underlying string of memory cells to a lesser extent than the pillars of the first group of pillars. Forming the pillars neighboring (e.g., adjacent to) the additional slots to be horizontally offset from the center of the underlying strings of memory cells may facilitate an increased width of the additional slots, which may facilitate improved uniformity of the additional conductive structures forming.

The microelectronic device may be formed by forming pillars including channel material extending through the stack structure and forming the other stack structure over the stack structure. The stack structure may comprise tiers comprising alternating insulative structures and other insulative structures. The other stack structure may include tiers of alternating additional insulative structures and additional other insulative structures. Pillars comprising a channel material may be formed over each of the pillars of the stack structure and in electrical communication with the channel material. A slot structure may be formed through the stack structure and the other stack structure to divide the microelectronic device into one or more block structures. The other insulative structures may be removed and replaced with conductive structures through the slot structures to form strings of memory cells. The additional other insulative structures may simultaneously be removed and replaced with additional conductive structures through the slot structure to form select gate structures. Additional slot structures may be formed through at least a portion of the other stack structure to form one or more sub-block structures in each block structure. The additional slot structures may exhibit a non-linear shape, including one or more arcuate surfaces defining a weave pattern between columns of the pillars of the other stack structure. The pillars directly neighboring (e.g., adjacent to) the additional slot structures may be horizontally offset from the underlying strings of memory cells in a direction away from the additional slot structures. In some embodiments, a distance between pillars of neighboring columns of the second pillars separated by one of the additional slots may be greater than a distance between neighboring pillars that are not separated by the additional slot structures. The increased distance between the pillars neighboring (e.g., adjacent to) the additional slot structures may facilitate formation of additional slot structures having a greater horizontal dimension, which may facilitate improved formation of the additional conductive structures and formation of select gate structures (e.g., select gate drain (SGD) structures) exhibiting improved properties, such as a reduced threshold voltage.

Figure 1B:
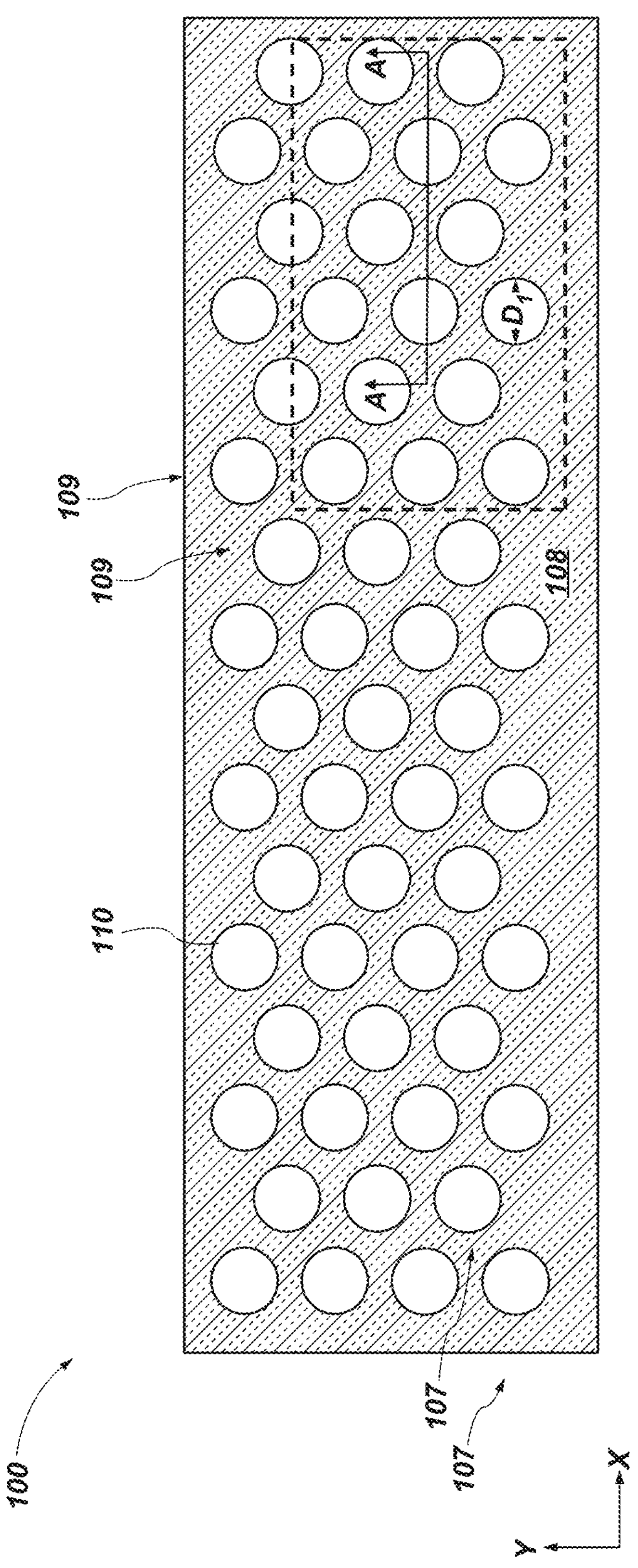
Figure 1C:
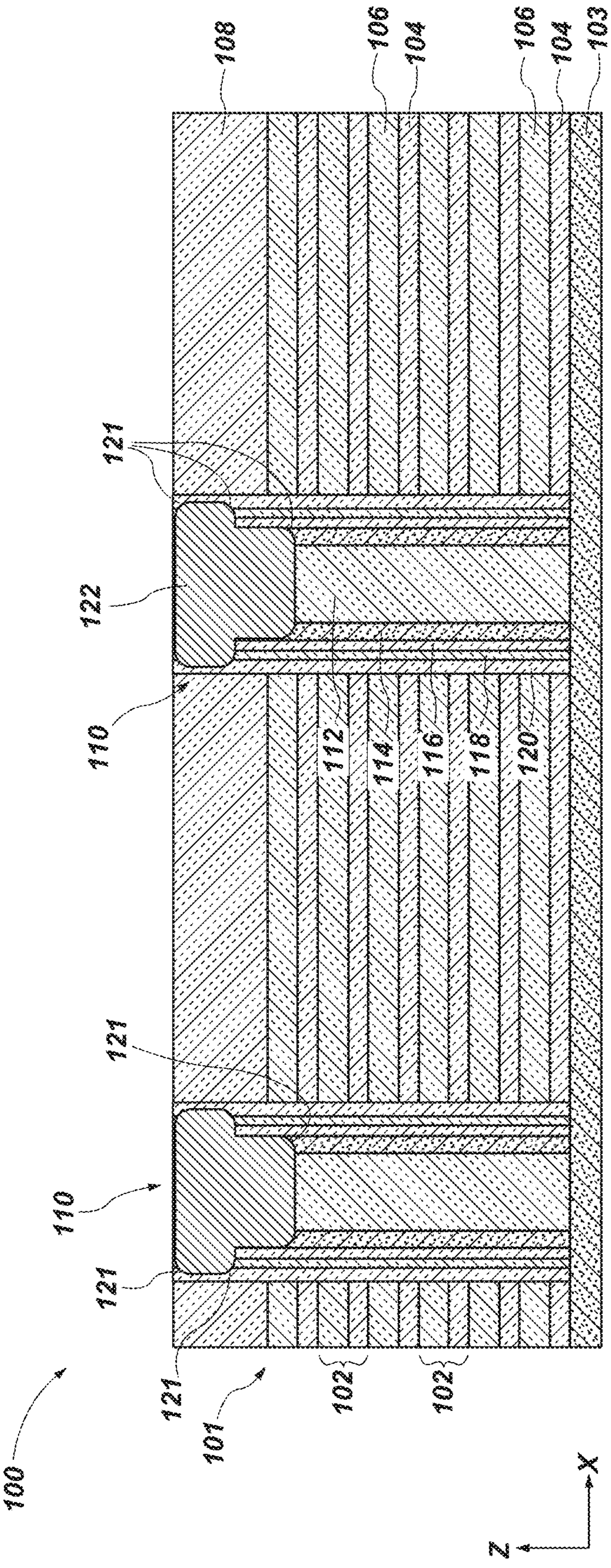
Figure 1D:
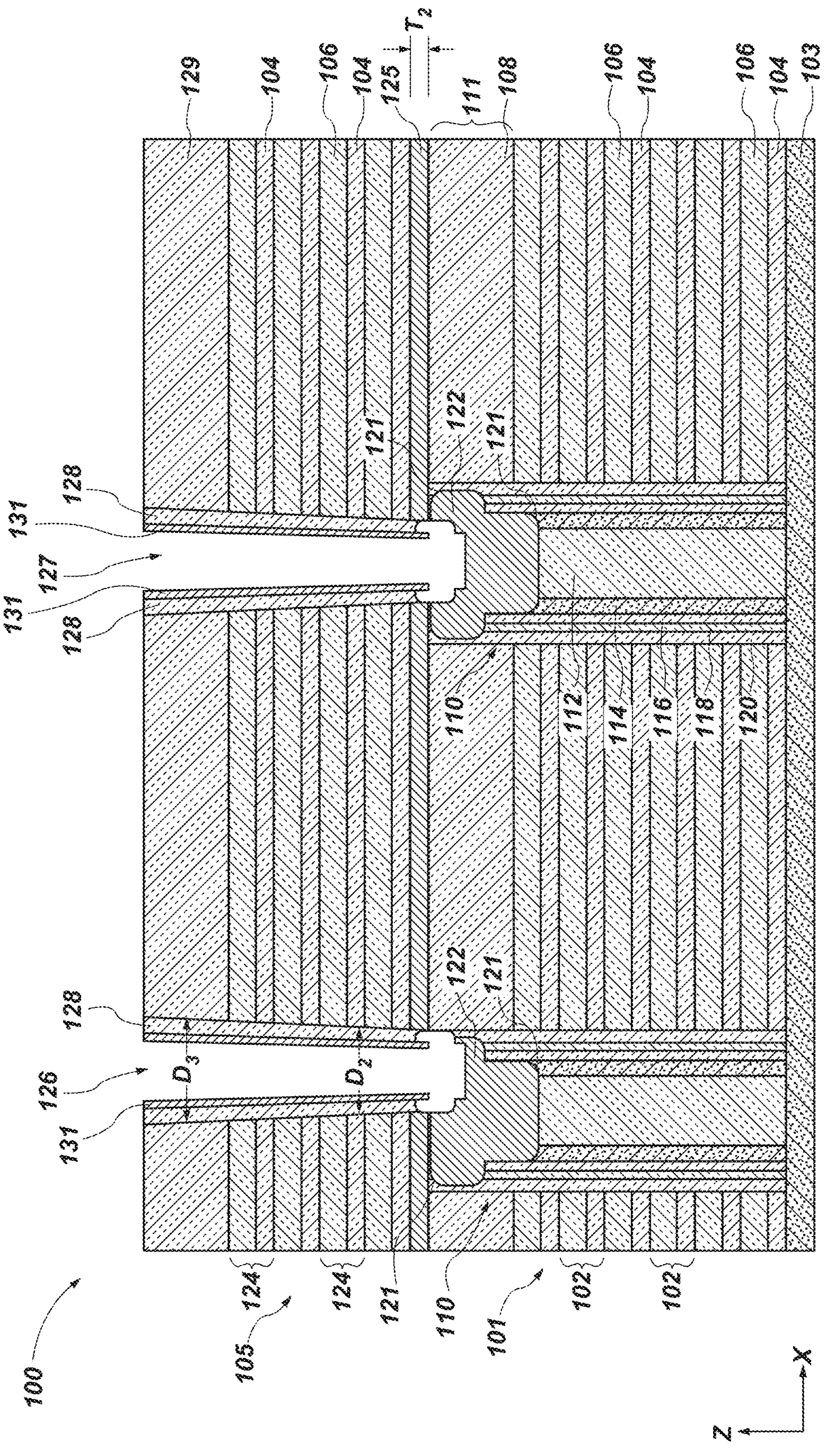
Figure 1E:
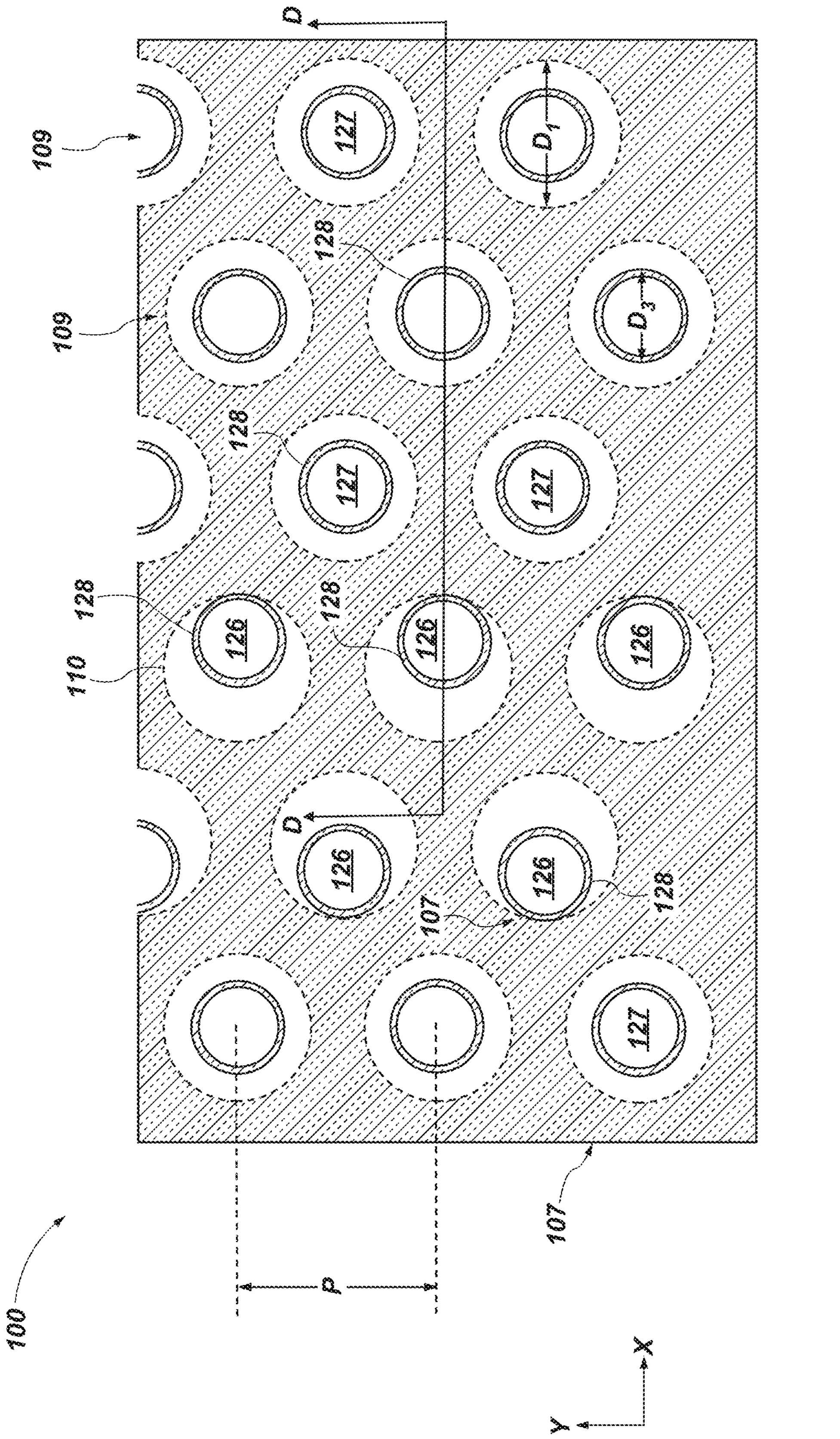
Figure 1F:
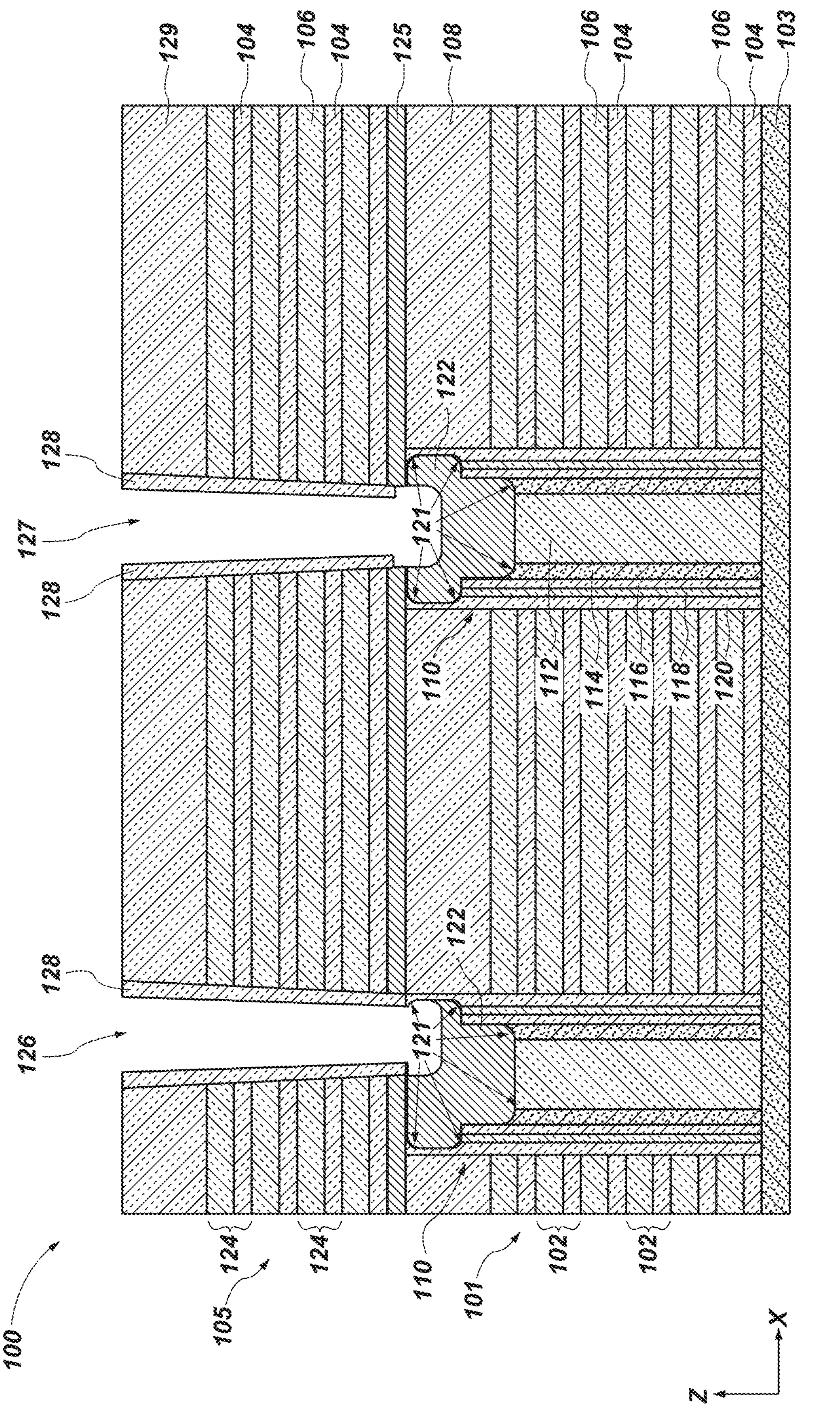
Figure 1G:
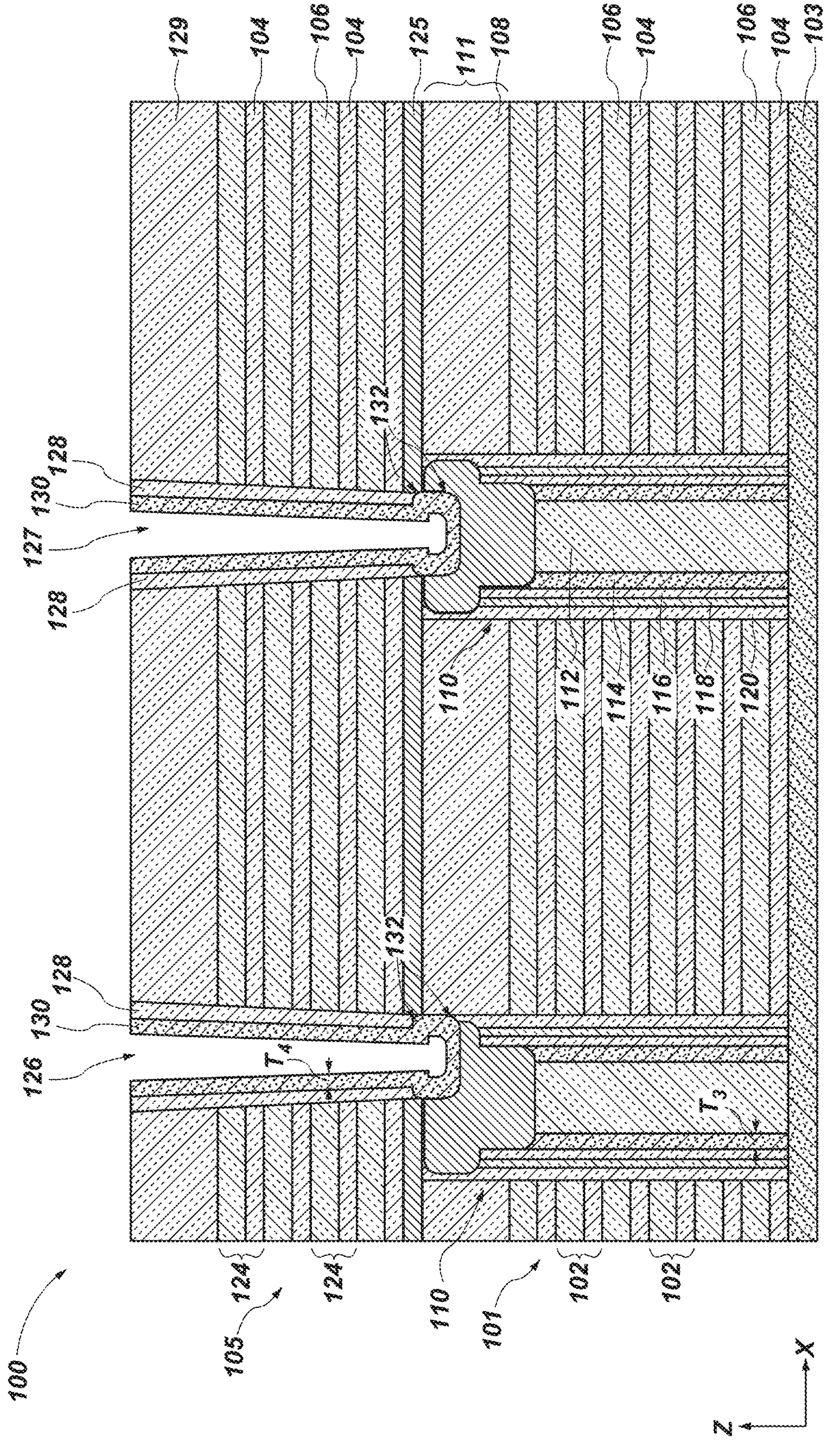
Figure 1H:
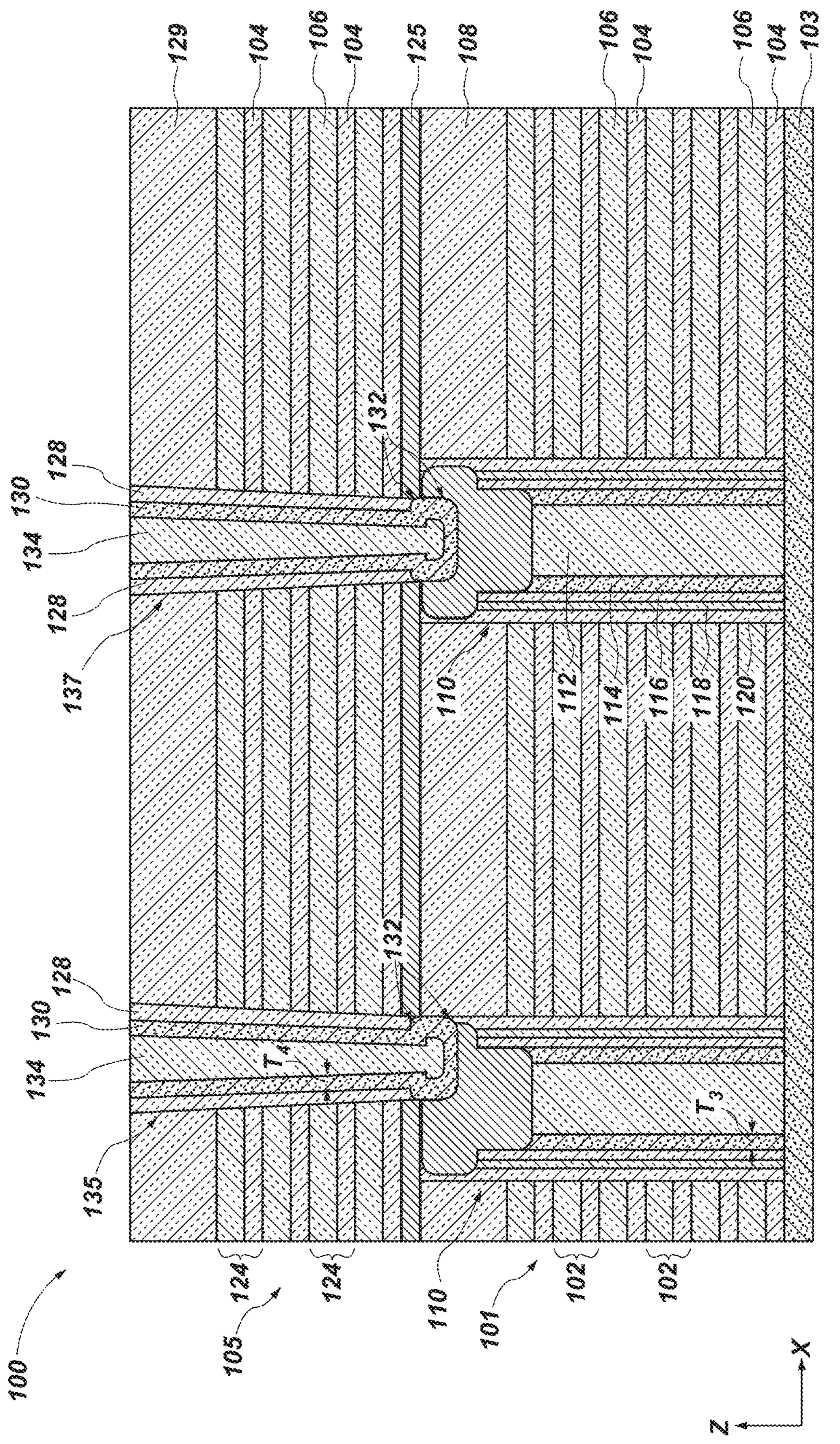
Figure 1I:
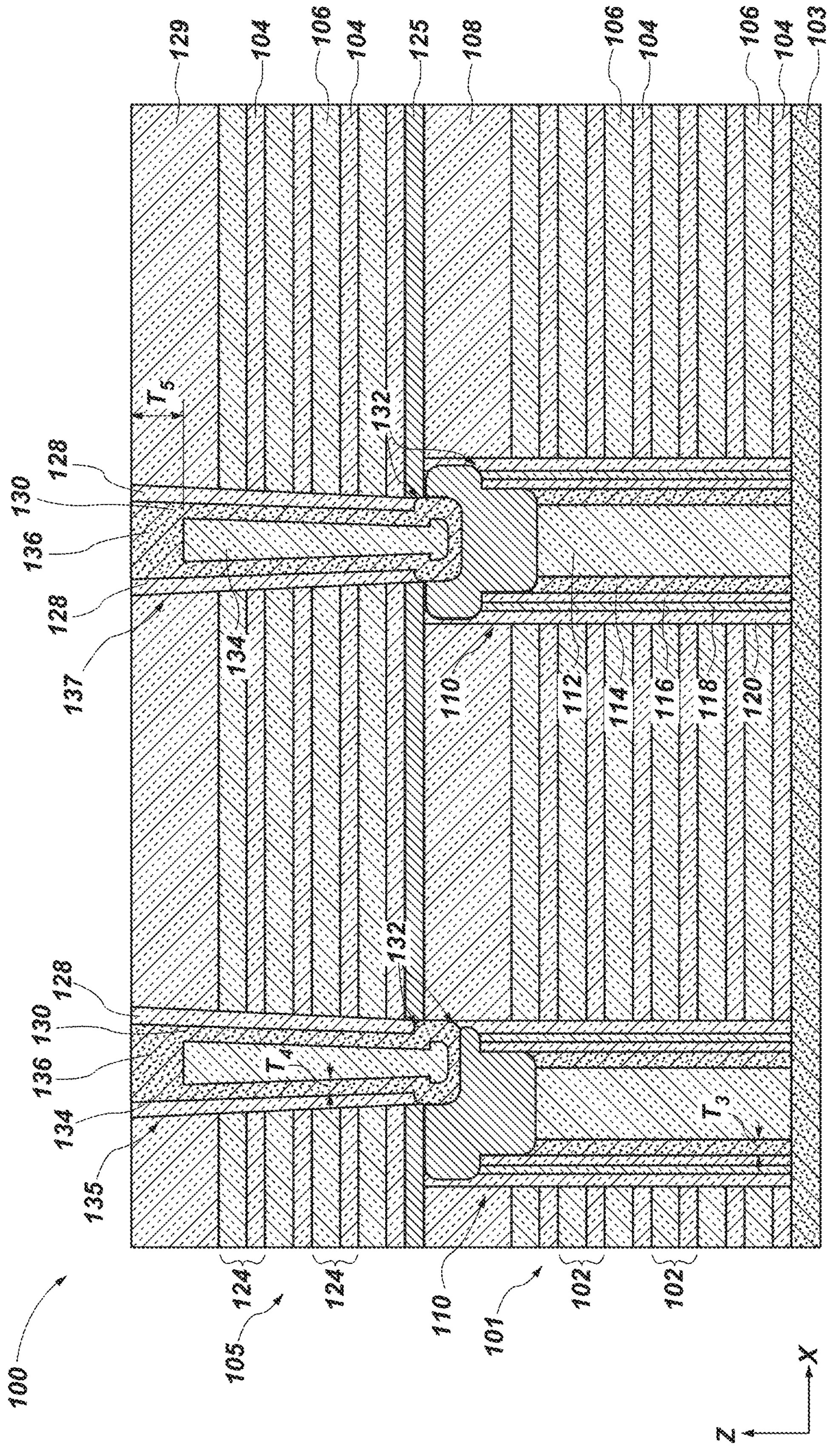
Figure 1J:
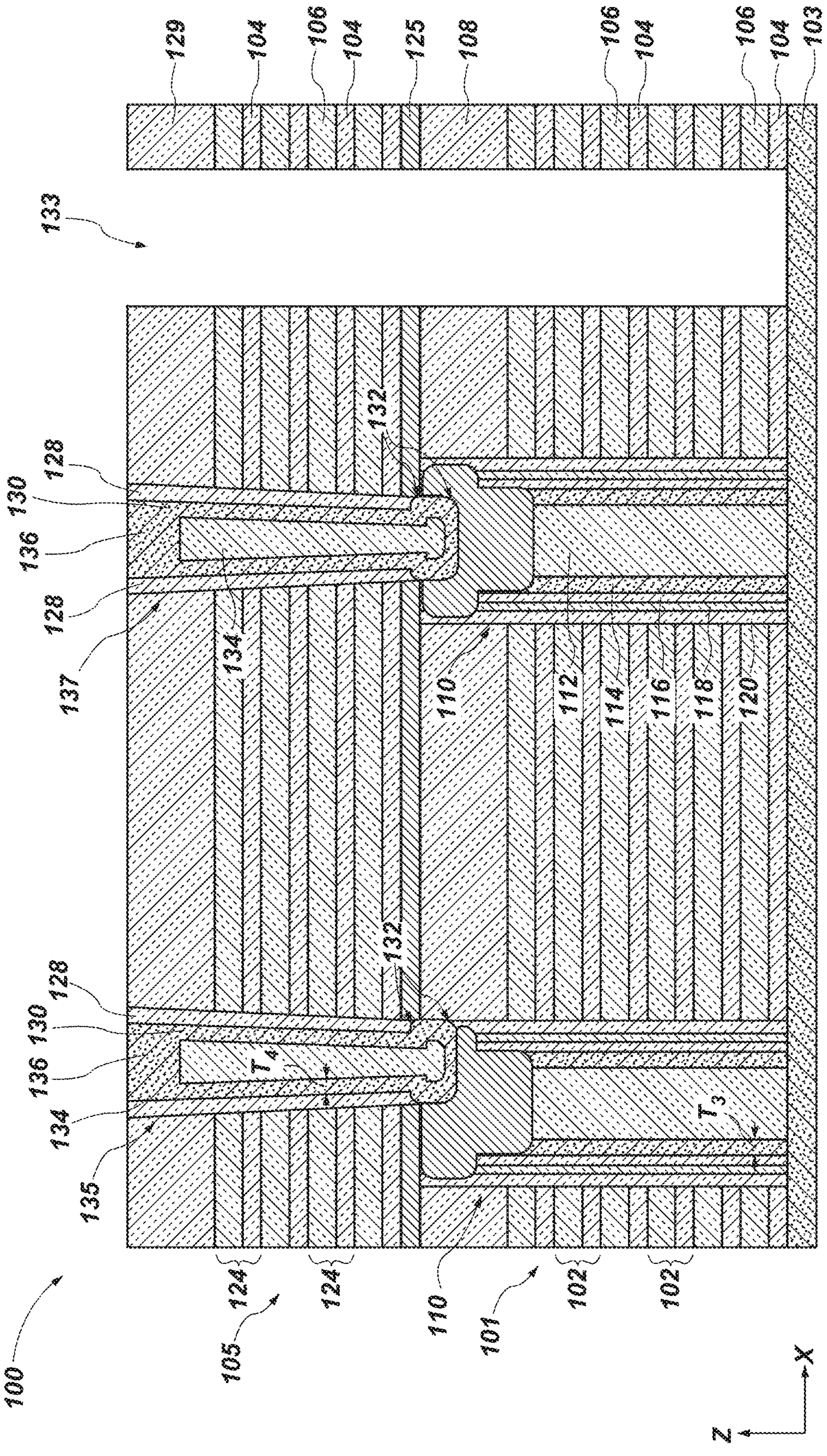
Figure 1K:
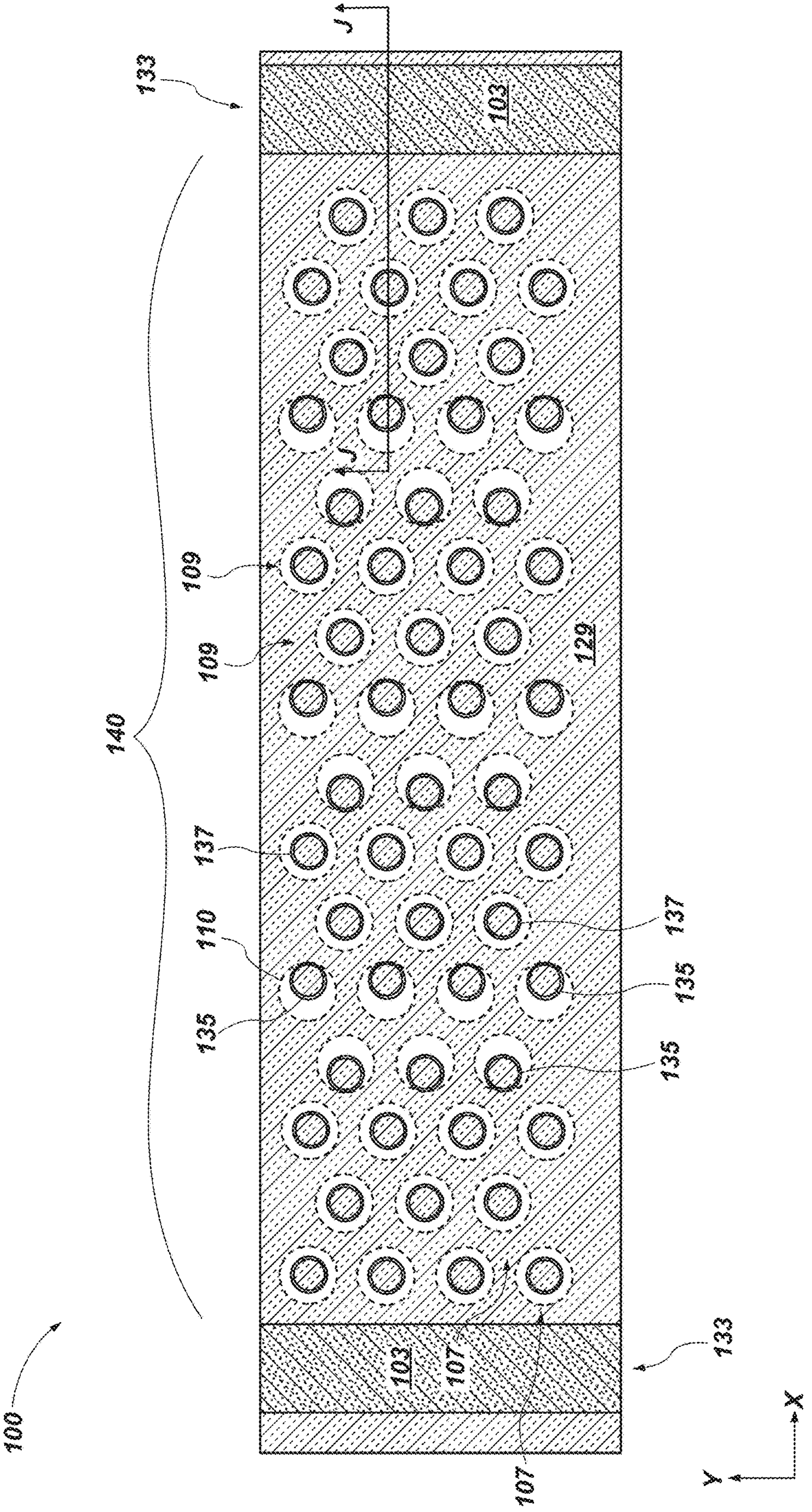
Figure 1L:
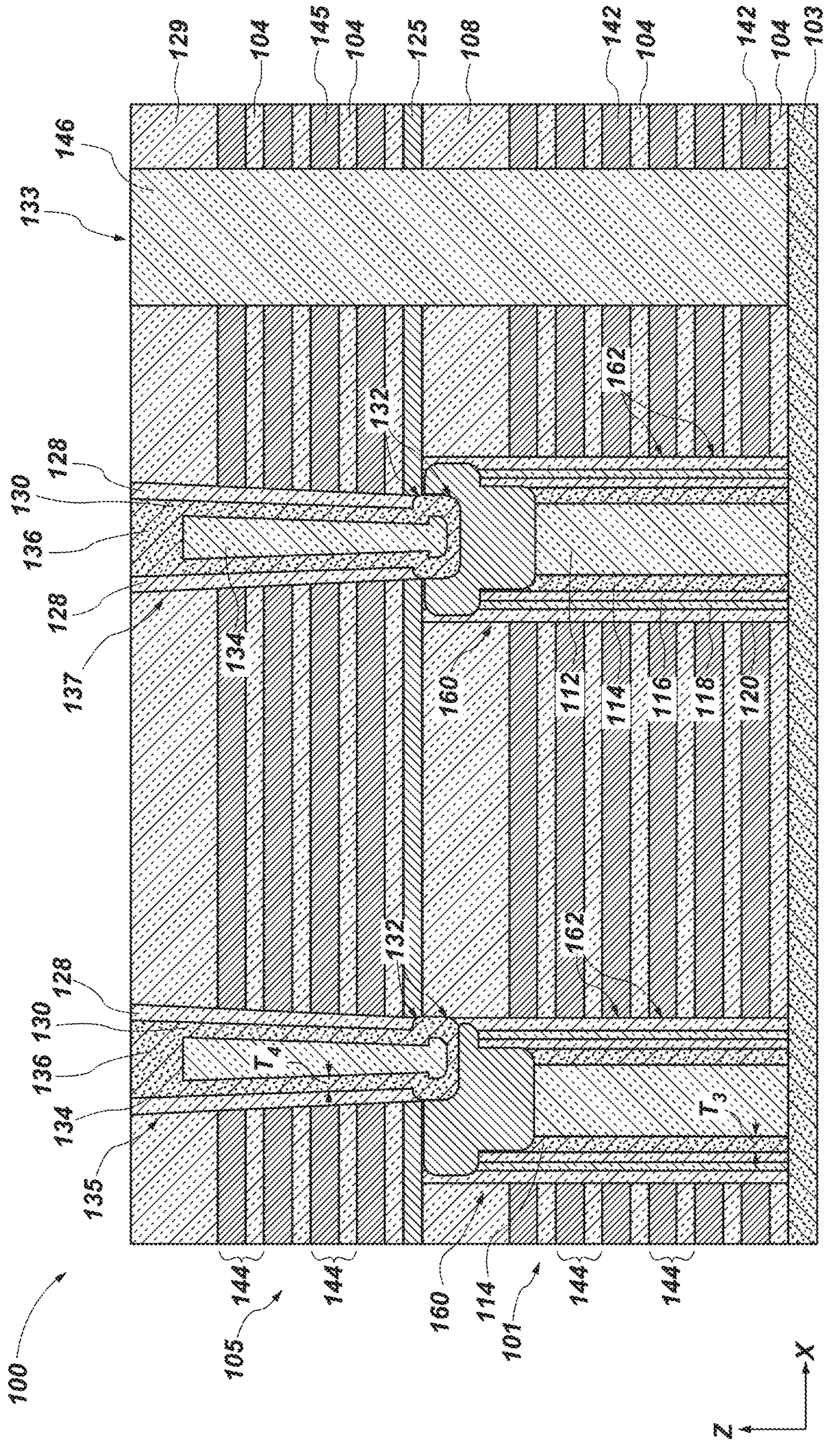
Figure 1M:
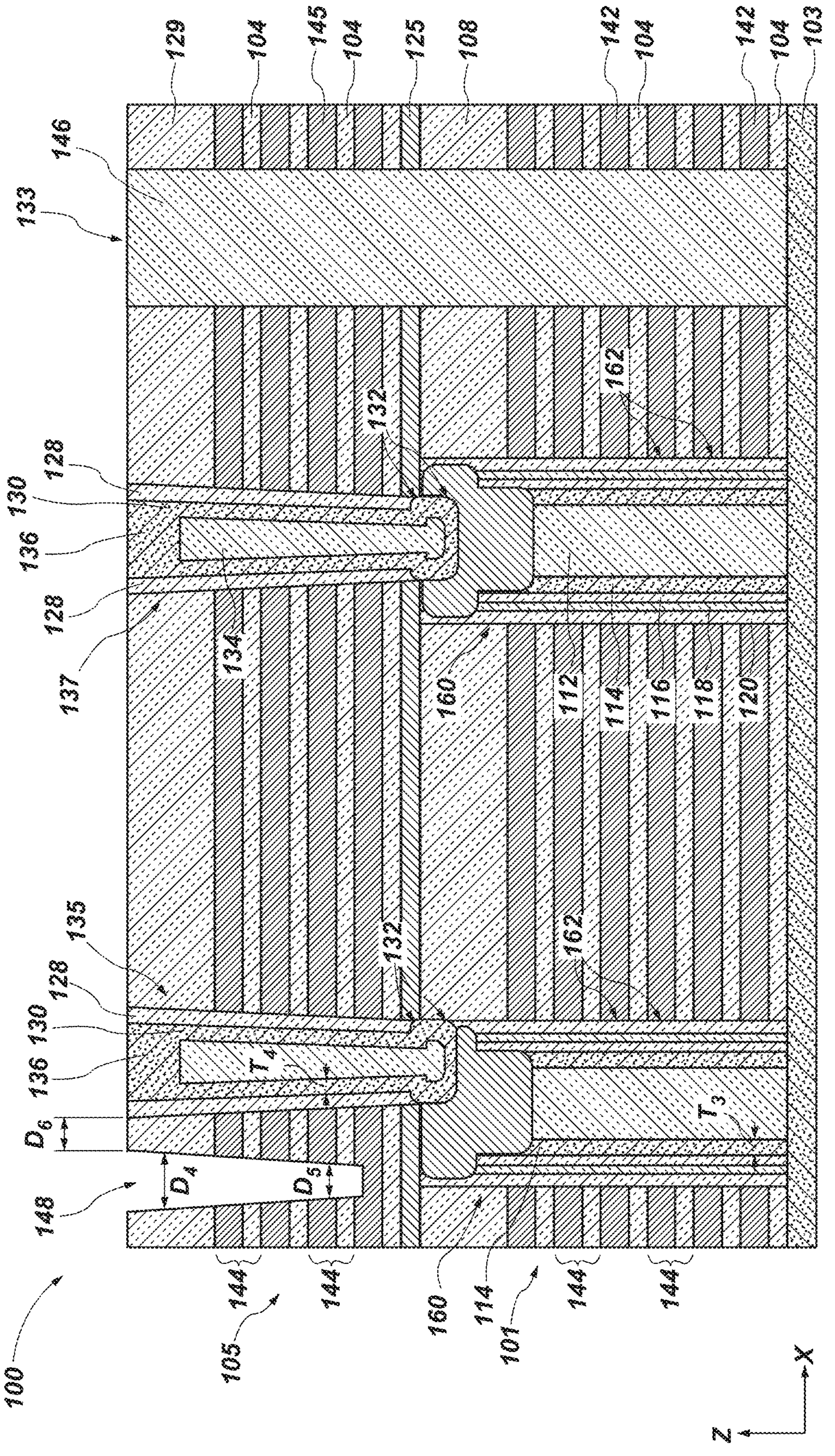
Figure 1N:
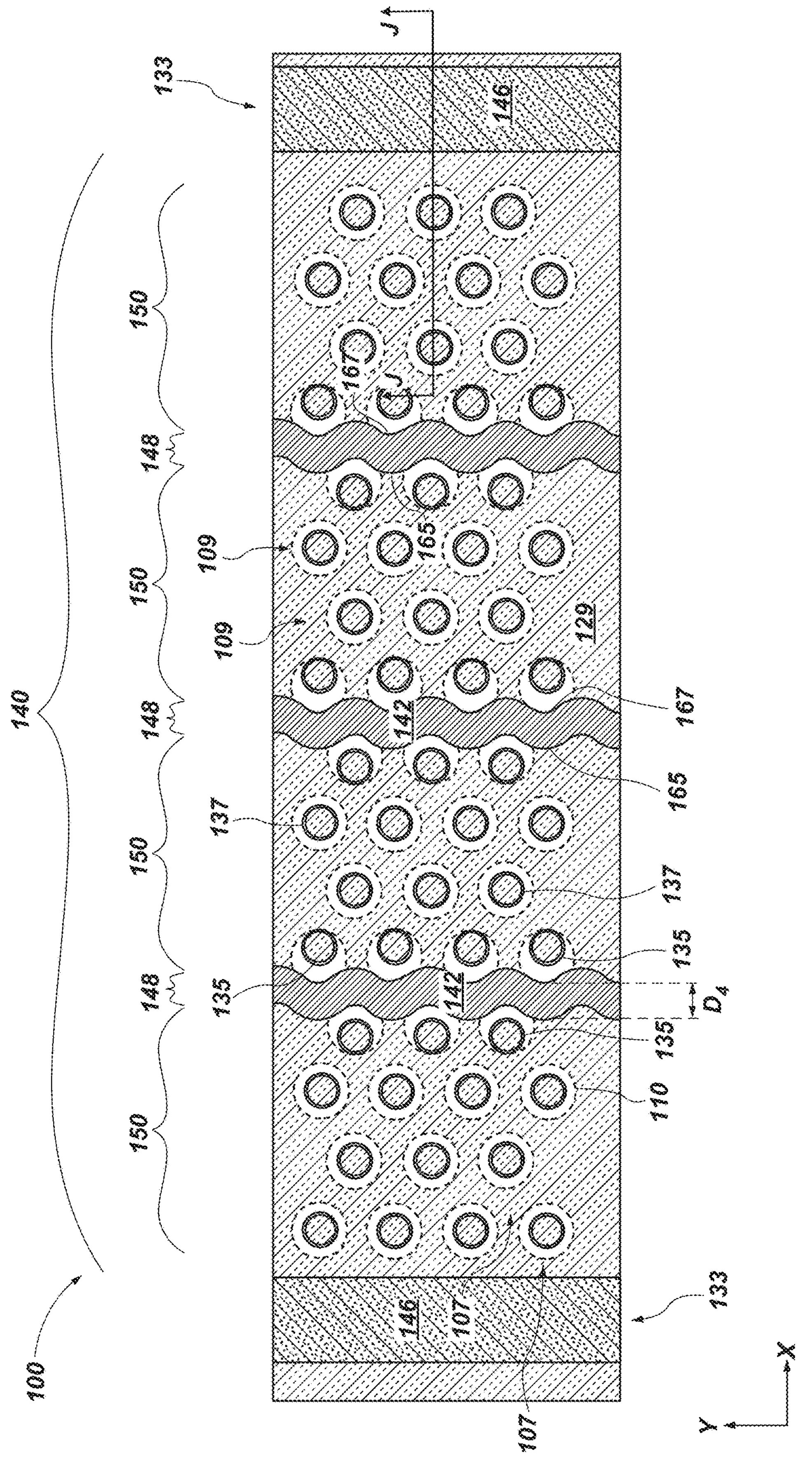
Figure 1O:
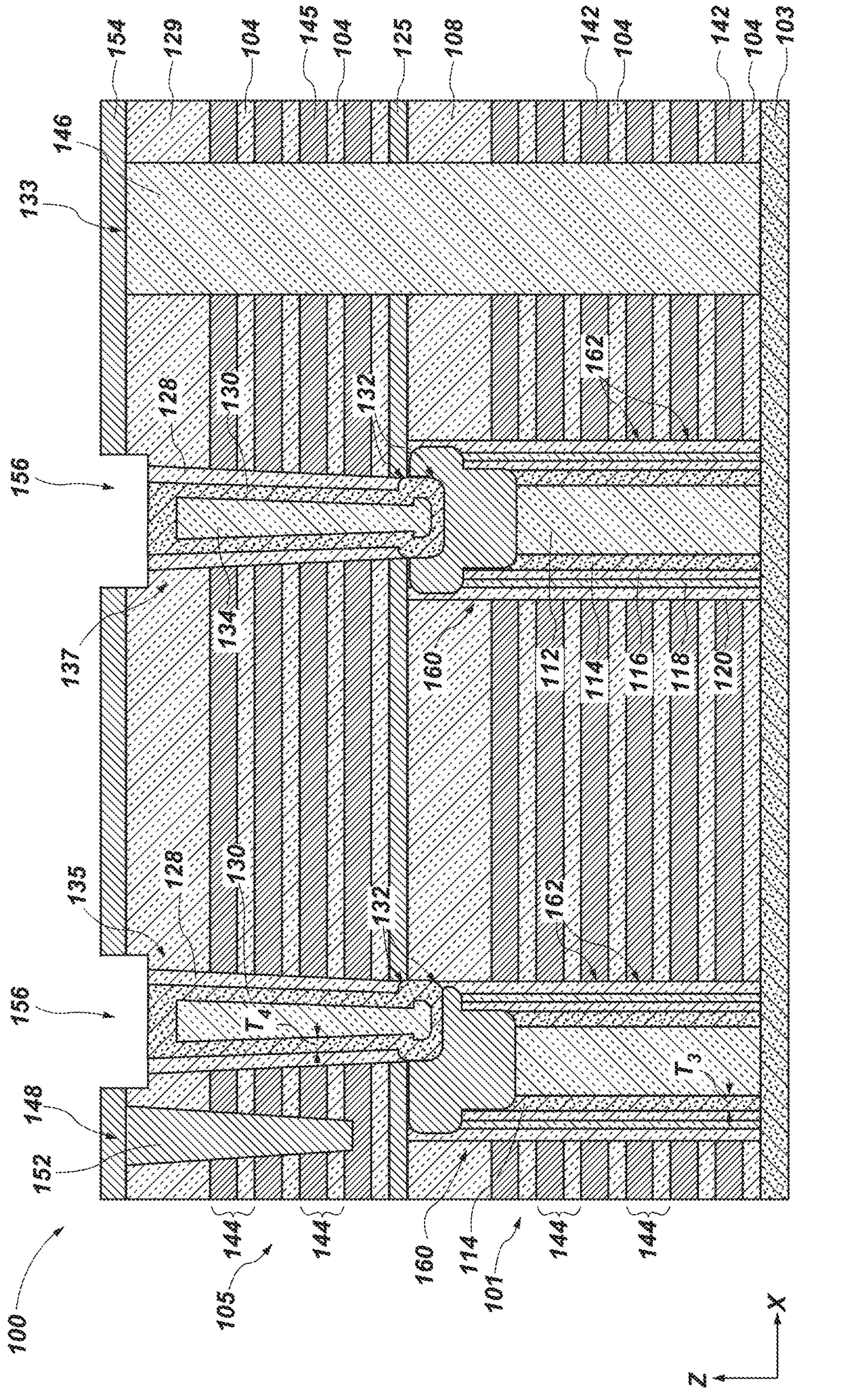
Figure 1P:
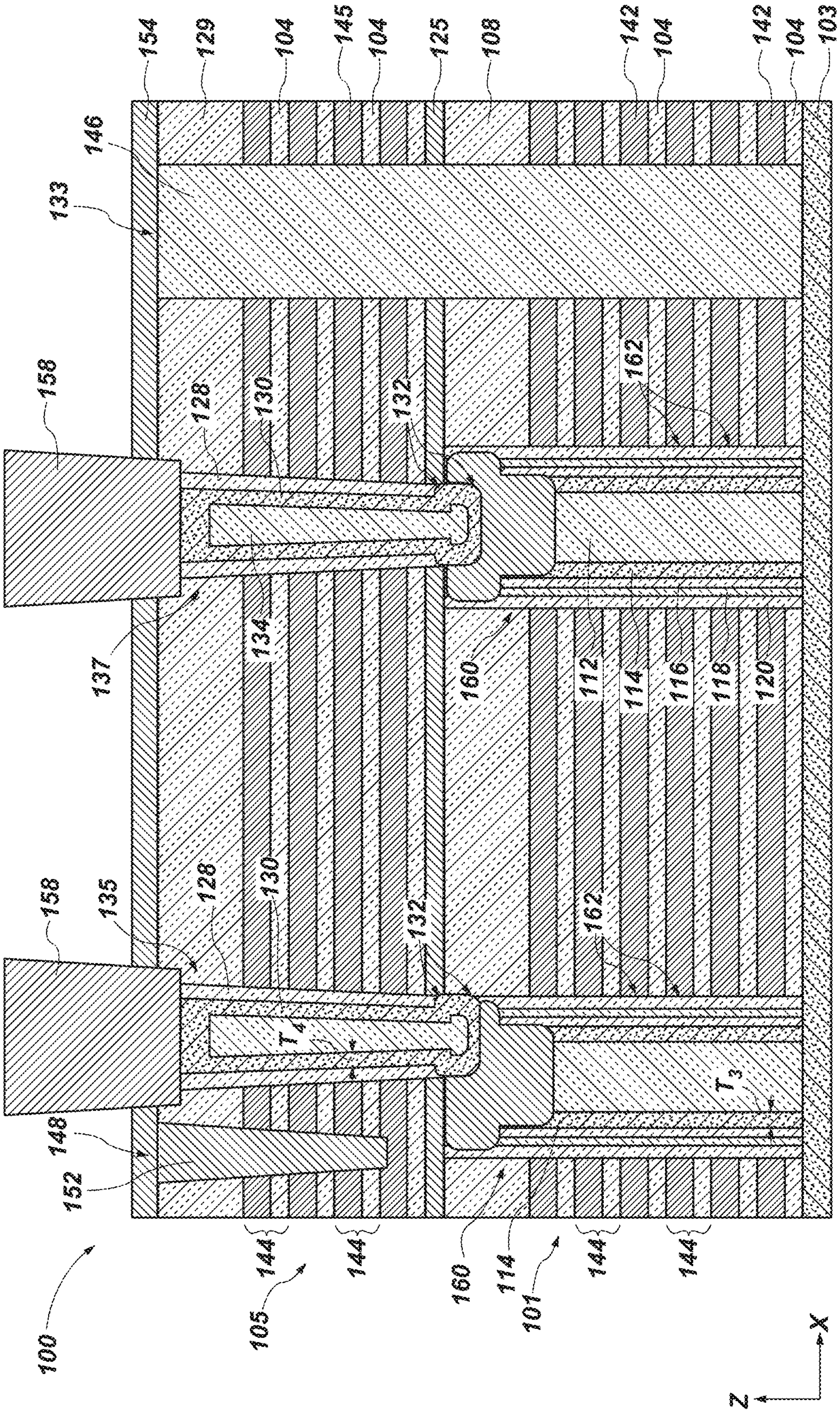

FIG. 1A through FIG. 1P illustrate a method of forming a microelectronic device structure, in accordance with embodiments of the disclosure. FIG. 1A is a simplified partial cross-sectional view of a microelectronic device structure 100, in accordance with embodiments of the disclosure. FIG. 1B is a top view of the microelectronic device structure 100 of FIG. 1A. The cross-section of FIG. 1A is taken through section line A-A of FIG. 1B. The microelectronic device structure 100 may include a stack structure 101 including a vertically (e.g., in the Z-direction) alternating sequence of insulative structures 104 and other insulative structures 106 arranged in tiers 102. Each of the tiers 102 may individually include a level of an insulative structure 104 directly vertically neighboring (e.g., adjacent) a level of the other insulative structures 106. The insulative structures 104 of the stack structure 101 may also be referred to herein as "insulative materials" and the other insulative structures 106 of the stack structure 101 may also be referred to herein as "other insulative materials."

In some embodiments, a number (e.g., quantity) of tiers 102 of the stack structure 101 may be within a range from 32 of the tiers 102 to 256 of the tiers 102. In some embodiments, the stack structure 101 includes 128 of the tiers 102. However, the disclosure is not so limited, and the stack structure 101 may include a different number of the tiers 102. In addition, in some embodiments, the stack structure 101 comprises a first deck structure vertically overlying a source structure 103 and comprising tiers 102 of the insulative structures 104 and the other insulative structures 106, and a second deck structure over the first deck structure, the second deck structure comprising tiers 102 of the insulative structures 104 and the other insulative structures 106. In some such embodiments, the first deck structure may be separated by the second deck structure by an interdeck region. For example, the stack structure 101 may comprise a dual deck 3D NAND device (e.g., a 3D NAND Flash memory device). In some embodiments, the stack structure 101 may be referred to herein as a deck structure or a first deck structure.

The levels of the insulative structures 104 may be formed of and include, for example, at least one dielectric material, such as one or more of an oxide material (e.g., silicon dioxide ($SiO_2$)), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), and aluminum oxide ($Al_2O_3$). In some embodiments, the insulative structures 104 are formed of and include silicon dioxide.

The levels of the other insulative structures 106 may be formed of and include an insulative material that is different than, and exhibits an etch selectivity with respect to, the insulative structures 104. In some embodiments, the other insulative structures 106 are formed of and include a nitride material (e.g., silicon nitride ($Si_3N_4$)) or an oxynitride material (e.g., silicon oxynitride). In some embodiments, the other insulative structures 106 comprise silicon nitride.

The stack structure 101 may be formed over the source structure 103 (e.g., a source plate). The source structure 103 may be formed of and include, for example, a semiconductor material doped with one or more P-type conductivity materials (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth). Although FIG. 1A has been described and illustrated as including the stack structure 101 directly over (e.g., on) the source structure 103, the disclosure is not so limited. In other embodiments, the stack structure 101 overlies a deck structure comprising additional tiers 102 of insulative structures 104 and other insulative structures 106 separated from the stack structure 101 by at least one dielectric material.

A dielectric material 108 may be located over an uppermost one of the tiers 102. The dielectric material 108 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 108 comprises the same material composition as the insulative structures 104. In some embodiments, the dielectric material 108 comprises silicon dioxide.

A thickness $T_1$ (e.g., in the Z-direction) of the dielectric material 108 may be within a range from about 40 nanometers (nm) to about 80 nm, such as from about 40 nm to about 60 nm, or from about 60 nm to about 80 nm. In some embodiments, the thickness $T_1$ is about 60 nm. However, the disclosure is not so limited and the thickness $T_1$ may be different than that described above.

Pillars 110 (e.g., cell pillars) of materials may vertically extend (e.g., in the Z-direction) through the stack structure 101. As will be described herein, the materials of the pillars 110 may form memory cells (e.g., strings of memory cells). The pillars 110 may each individually comprise an insulative material 112, a channel material 114 horizontally neighboring the insulative material 112, a tunnel dielectric material (also referred to as a "tunneling dielectric material") 116 horizontally neighboring the channel material 114, a memory material 118 horizontally neighboring the tunnel dielectric material 116, and a dielectric blocking material (also referred to as a "charge blocking material") 120 horizontally neighboring the memory material 118. The dielectric blocking material 120 may be horizontally neighboring one of the levels of other insulative structures 106 of one of the tiers 102 of the stack structure 101. The channel material 114 may be horizontally interposed between the insulative material 112 and the tunnel dielectric material 116; the tunnel dielectric material 116 may be horizontally interposed between the channel material 114 and the memory material 118; the memory material 118 may be horizontally interposed between the tunnel dielectric material 116 and the dielectric blocking material 120; and the dielectric blocking material 120 may be horizontally interposed between the memory material 118 and a level of the other insulative structure 106.

The insulative material 112 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 112 comprises silicon dioxide.

The channel material 114 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 114 includes amorphous silicon or polysilicon. In some embodiments, the channel material 114 comprises a doped semiconductor material.

The tunnel dielectric material 116 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 116 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 116 comprises silicon dioxide. In other embodiments, the tunnel dielectric material 116 comprises silicon oxynitride.

The memory material 118 may comprise a charge trapping material or a conductive material. The memory material 118 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 118 comprises silicon nitride.

The dielectric blocking material 120 may be formed of and include a dielectric material such as, for example, one or more of an oxide (e.g., silicon dioxide), a nitride (silicon nitride), and an oxynitride (silicon oxynitride), or another material. In some embodiments, the dielectric blocking material 120 comprises silicon oxynitride.

In some embodiments the tunnel dielectric material 116, the memory material 118, and the dielectric blocking material 120 together may comprise a structure configured to trap a charge, such as, for example, an oxide-nitride-oxide (ONO) structure. In some such embodiments, the tunnel dielectric material 116 comprises silicon dioxide, the memory material 118 comprises silicon nitride, and the dielectric blocking material 120 comprises silicon dioxide.

Referring to FIG. 1B, some of the pillars 110 may be aligned with each other (e.g., in the Y-direction) and other of the pillars 110 may be offset from each other (e.g., in the Y-direction). The pillars 110 may be arranged in a so-called weave pattern (e.g., a hexagonal close-packed arrangement), which may facilitate an increased density of the pillars 110 (and the resulting strings of memory cells) in the stack structure 101. The pillars 110 may be arranged in rows 107 extending in a first horizontal (e.g., lateral) direction (e.g., in the X-direction) and columns 109 extending in a second horizontal direction (e.g., in the Y-direction). In some embodiments, the pillars 110 in a column 109 may be laterally offset (e.g., in each of the X-direction and the Y-direction) from pillars 110 in a neighboring (e.g., adjacent) column 109. In addition, the pillars 110 of every other column 109 may be horizontally aligned (e.g., in the Y-direction). Similarly, the pillars 110 of a row 107 may be horizontally offset (e.g., in each of the X-direction and the Y-direction) from pillars 110 in a neighboring (e.g., adjacent) row 107. In addition, the pillars 110 of every other row 107 may be horizontally aligned (e.g., in the X-direction).

With continued reference to FIG. 1A and FIG. 1B, a dimension $D_1$ (e.g., a diameter) of the pillars 110 may be within a range from about 100 nm to about 150 nm, such as from about 100 nm to about 110 nm, from about 110 nm to about 120 nm, from about 120 nm to about 130 nm, from about 130 nm to about 140 nm, or from about 140 nm to about 150 nm. In some embodiments, the dimension $D_1$ is about 120 nm. However, the disclosure is not so limited and the dimension $D_1$ may be different than those described.

With reference to FIG. 1C, after forming the pillars 110, a portion of the pillars 110 may be removed to recess the pillars 110 relative to an uppermost surface of the dielectric material 108. In some embodiments, a portion of the insulative material and the channel material 114 may be recessed vertically lower (e.g., in the Z-direction) than the other components of the pillars 110 (e.g., the tunnel dielectric material 116, the memory material 118, the dielectric blocking material 120). In some embodiments, removal of the portion of the pillars 110 may form rounded portions 121 (also referred to as "rounded corners") of at least some of the remaining portions of the pillars 110. The rounded portions 121 may exhibit an arcuate shape. In some embodiments, portions of the dielectric blocking material 120 may remain, leaving rounded portions 121 of the dielectric blocking material 120. As will be described herein, the rounded portions 121 may facilitate formation of a channel region (e.g., a channel material 130 (FIG. 1G)) exhibiting corresponding rounded portions.

In some embodiments, a conductive material 122 may be formed within the recesses to form a so-called "conductive plug structure." The conductive material 122 may be formed of and include, a polysilicon or another material formulated to exhibit an etch selectivity with respect to the material of the dielectric material 108 and, in some embodiments, with respect to one or more of the materials of the pillar 110. In some embodiments, the conductive material 122 is formed of and includes polysilicon. In some embodiments, the conductive material 122 is electrically connected to (e.g., in electrical communication with) the channel material 114. In some embodiments, the conductive material 122 comprises doped polysilicon. In some embodiments, the conductive material 122 is doped with one or more n-type dopants such as, for example, phosphorus. In some embodiments, the conductive material 122 is lightly doped (e.g., at a concentration of about $1\times10^{18}$ atoms/$cm^3$).

After forming the conductive material 122, the microelectronic device structure 100 may be exposed to a chemical mechanical planarization (CMP) process to remove conductive material from outside surfaces of the recesses (e.g., on an upper surface of the dielectric material 108). In some embodiments, the conductive material 122 exposed to an oxidation process to form rounded portions 121 at vertically upper (e.g., in the Z-direction) portions thereof. In other embodiments, the upper portions of the conductive material 122 comprise sharp corners, and the conductive material 122 includes the rounded portions 121 at the vertically lower (e.g., in the Z-direction) portions thereof.

Referring collectively to FIG. 1D and FIG. 1E, after forming the conductive material 122, another stack structure 105 (e.g., an upper stack structure, a select gate drain (SGD) stack structure) (which may also be referred to herein as a "second deck structure") may be formed over the stack structure 101. FIG. 1D is a simplified partial cross-sectional view of the microelectronic device structure 100 taken through section line D-D of FIG. 1E. FIG. 1E is a top view of a portion of the microelectronic device structure 100 illustrating the portion of the microelectronic device structure 100 corresponding to the location of box E of FIG. 1B. In FIG. 1E, the pillars 110 are illustrated in broken lines to indicate that they are located below an upper surface of the microelectronic device structure 100.

With reference to FIG. 1D, the other stack structure 105 may include alternating levels of additional insulative structures 104 and the additional other insulative structures 106 formed over an etch stop material 125. The alternating levels of the insulative structures 104 and the other insulative structures 106 may be arranged in tiers 124. The dielectric material 108 between the stack structure 101 and the other stack structure 105 may be referred to as an interdeck region 111. The other stack structure 105 may include an uppermost insulative structure 129 having a greater thickness in a vertical direction (e.g., in the Z-direction) than other insulative structures 104 of the other stack structure 105.

The etch stop material 125 may be formed of and include, for example, a material exhibiting an etch selectivity with respect to the insulative structures 104 and the other insulative structures 106. In some embodiments, the etch stop material 125 comprises a carbon-containing material (e.g., silicon carbon nitride (SiCN)). In some such embodiments, the etch stop material 125 may facilitate an improved electric field through a channel region proximate the etch stop material 125 during use and operation of the microelectronic device structure 100. In some embodiments, the microelectronic device structure 100 may not include the etch stop material 125 between the stack structure 101 and the other stack structure 105. In some such embodiments, the dielectric material 108 may intervene between the stack structure 101 and the other stack structure 105.

A thickness $T_2$ of the etch stop material 125 may be within a range from about 10 nm to about 30 nm, such as from about 10 nm to about 20 nm, or from about 20 nm to about 30 nm. In some embodiments, the thickness $T_2$ is about 20 nm. However, the disclosure is not so limited and the thickness $T_2$ may be different than those described.

After forming the other stack structure 105, first openings 126 and second openings 127 (collectively referred to as openings 126, 127) may be formed through the other stack structure 105 to the conductive material 122. In some embodiments, the first openings 126 are offset (e.g., are not concentric) with the pillars 110 and the second openings 127 are aligned (e.g., concentric) with the pillars 110. In other embodiments, the second openings 127 are horizontally offset from a center of the underlying pillars 110, but to a lesser extent than the first openings 126. In some such embodiments, the second openings 127 are not substantially concentric with a center of the underlying pillars 110, but a center of the second openings 127 may be located closer to a center of the underlying pillars 110 than the center of the first openings 126 are located to a center of underling pillars 110. As will be described herein, the first openings 126 may neighbor (e.g., be located adjacent to) slot structures separating block structures of the microelectronic device structure 100 into one or more sub-block structures.

A dimension $D_2$ (e.g., a diameter) of a lower portion of the openings 126, 127 may be within a range from about 40 nm to about 70 nm, such as from about 40 nm to about 50 nm, from about 50 nm to about 60 nm, or from about 60 nm to about 70 nm. In some embodiments, the dimension $D_2$ may be within a range from about 50 nm to about 60 nm, such as about 55 nm.

A dimension $D_3$ (e.g., a diameter) of an upper portion of the openings 126, 127 may be within a range from about 50 nm to about 80 nm, such as from about 50 nm to about 60 nm, from about 60 nm to about 70 nm, or from about 70 nm to about 80 nm. In some embodiments, the dimension $D_3$ is from about 55 nm to about 65 nm, such as about 60 nm. In some embodiments, the dimension $D_3$ is larger than the dimension $D_2$ and sidewalls of the openings 126, 127 exhibit a tapered (e.g., angled) shape with respect to a major surface of the source structure 103. In some embodiments, the dimension $D_1$ of the pillars 110 is about twice as large as the dimension $D_3$.

With reference to FIG. 1E, in some embodiments, the first openings 126 are arranged in columns 109 (e.g., extending in the Y-direction) and the second openings 127 are arranged in columns 109 horizontally neighboring the columns 109 of the first openings 126. In some such embodiments, the first openings 126 may be horizontally aligned (e.g., in the X-direction) with other first openings 126 of a same column 109 of first openings 126 and the second openings 127 may be horizontally aligned (e.g., in the X-direction) with other second openings 127 of a same column 109 of second openings 127.

After forming the first openings 126 and the second openings 127, a first liner material 128 may be formed over surfaces (e.g., sidewalls) of the first openings 126 and the second openings 127. A second liner material 131 may be formed over and in contact with the first liner material 128. The first liner material 128 may be formed of and include, for example, an insulative material, such as one or more of the materials described above with reference to the insulative material 112. In some embodiments, the first liner material 128 comprises silicon dioxide. In some embodiments, the second liner material 131 is formed of and includes polysilicon. After forming the first liner material 128 and the second liner material 131, in some embodiments, the second liner material 131 may be exposed to a punch etch to expose a portion of the conductive material 122.

With continued reference to FIG. 1E, a pitch P between horizontally neighboring (e.g., in the Y-direction, a direction in which the slot structures will be formed) pillars 110 (and openings 126, 127) may be within a range from about 120 nm to about 180 nm, such as from about 120 nm to about 140 nm, from about 140 nm to about 160 nm, or from about 160 nm to about 180 nm. In some embodiments, the pitch P is from about 140 nm to about 150 nm or from about 150 nm to about 160 nm. However, the disclosure is not so limited and the pitch P may be different than that described.

With continued reference to FIG. 1E, after removing the horizontally extending portions of the second liner material 131 and the first liner material 128, a vertically lower (e.g., in the Z-direction) portion of the first liner material 128 may be exposed to an etchant to form additional rounded portions 121. Upper portions of the first liner material 128 may not be substantially exposed to the etchant since they are covered by the second liner material 131.

With reference to FIG. 1F, after removing the vertically lower portions of the first liner material 128, the second liner material 131 and a portion of the conductive material 122 may be removed.

Referring now to FIG. 1G, a channel material 130 may be formed over sides of the first liner material 128 and in electrical communication with the channel material 114 through the conductive material 122. The channel material 130 may comprise one or more of the materials described above with reference to the channel material 114. In some embodiments, the channel material 130 comprises the same material composition as the channel material 114. In some embodiments, the channel material 130 may be continuous with the channel material 114. Since the channel material 130 may comprise the same material composition as the channel material 114 and the channel material 130 is in electrical communication with the channel material 114 through the conductive material 122, as used herein, the channel material 114, the conductive material 122, and the channel material 130 may be collectively referred to as a channel region.

In some embodiments, the channel material 130 may not exhibit sharp corners and may comprise rounded corners 132. The rounded corners 132 of the channel material 130 may exhibit an arcuate shape and may also be referred to herein as "radiused" corners.

The rounded corners 132 may be formed from the rounded portions 121 of, for example, the insulative material 112 and the dielectric blocking material 120. Accordingly, some of the rounded corners 132 may correspond to respective interfaces between the channel material 130 and each of the insulative material 112 and the dielectric blocking material 120. In some such embodiments, an interface between the channel material 114 and the insulative material 112 may include the rounded corners 132. In addition, an interface between the channel material 130 and the dielectric blocking material 120 may include rounded corners 132. In addition, exposed portions of the channel material 130 may include rounded corners 132.

The shape of the rounded corners 132 may facilitate improved electrical performance of devices (e.g., memory cells) associated with the channel material 114 and the channel material 130. For example, the rounded corners 132 may substantially reduce or prevent charge accumulation at regions of the channel material 130 (e.g., corners thereof) during use and operation of the microelectronic device structure 100. In addition, the rounded corners 132 may facilitate an improved electric field induced through the channel material 114 and the channel material 130.

With continued reference to FIG. 1G, in some embodiments, a thickness $T_3$ of the channel material 114 may be about the same as a thickness $T_4$ of the channel material 130. In other embodiments, the thickness $T_3$ of the channel material 114 is less than the thickness $T_4$ of the channel material 130. In yet other embodiments, the thickness $T_3$ of the channel material 114 is greater than the thickness $T_4$ of the channel material 130. In some embodiments, a thickness of the channel region (including the channel material 114, the channel material 130, and the conductive material 122) may be greater between the stack structure 101 and the additional stack structure 105 (e.g., proximate the interdeck region 111) than at other portions.

The thickness $T_3$ and the thickness $T_4$ may each individually be within a range of from about 5 nm to about 15 nm, such as from about 5 nm to about 10 nm, or from about 10 nm to about 20 nm. The thickness $T_4$ may be within a range from about 10 nm to about 30 nm, such as from about 10 nm to about 20 nm, or from about 20 nm to about 30 nm.

With reference to FIG. 1H, after forming the channel material 130, an insulative material 134 may be formed within remaining portions of the openings 126, 127 between the channel material 130 to form first upper pillar structures 135 and second upper pillar structures 137 from the respective first openings 126 and the second openings 127. The insulative material 134 may vertically overlie (e.g., in the Z-direction) the channel material 130, such as the horizontally extending portion of the channel material 130 over conductive material 122.

The first upper pillar structures 135 may be horizontally offset (e.g., in the X-direction, in the Y-direction) from a center of the vertically underlying (e.g., in the Z-direction) pillar 110. The second upper pillar structures 137 may be horizontally aligned with (e.g., in each of the X-direction and the Y-direction) a center of the vertically underlying (e.g., in the Z-direction) pillar 110. In some embodiments, the second upper pillar structures 137 may be horizontally offset from the center of the vertically underlying pillar 110, but to a lesser extent than the horizontal offset of the first upper pillar structures 135 from the vertically underlying pillar 110.

The insulative material 134 may be formed of and include one or more of the materials described above with reference to the insulative material 112. In some embodiments, the insulative material 134 comprises substantially the same material composition as the insulative material 112. In some embodiments, the insulative material 134 comprises silicon dioxide. In some embodiments, the microelectronic device structure 100 is exposed to a planarization process, such as a CMP process, after forming the insulative material 134.

Referring now to FIG. 1I, after forming the insulative material 134, at least a portion of the insulative material 134 may be recessed from within the upper pillar structures 135, 137 to form a recess. The recess may be filled with additional channel material to form a horizontally extending portion 136 of the channel material 130. The additional channel material may comprise the same material composition as the channel material 130.

A thickness (e.g., in the Z-direction) $T_5$ of the horizontally extending portion 136 of the channel material 130 may be within a range from about 30 nm to about 50 nm, such as from about 30 nm to about 40 nm, or from about 40 nm to about 50 nm. However, the disclosure is not so limited and the thickness $T_6$ may be different than those described.

With collective reference to FIG. 1J and FIG. 1K, after forming the horizontally extending portion 136 of the channel material 130, slots 133 may be formed through the other stack structure 105 and the stack structure 101. FIG. 1J is a simplified partial cross-sectional view of the microelectronic device structure 100 taken through section line J-J of FIG. 1K. The slots 133 may be referred to herein as "replacement gate" slots. In some embodiments, the slots 133 expose at a least a portion of the source structure 103.

Referring to FIG. 1K, the microelectronic device structure 100 may include slots 133 that are horizontally spaced from each other (e.g., in the X-direction) by a plurality of columns 109 of the pillars 110 and the upper pillar structures 135, 137. The microelectronic device structure 100 may be divided into block structures 140 between horizontally neighboring (e.g., in the X-direction) slots 133. Although FIG. 1K illustrates only one block structure 140, it will be understood that the microelectronic device structure 100 may include several block structures 140. As will be described herein, the block structures 140 may be divided into one or more sub-block structures.

Referring back to FIG. 1J, after forming the slots 133, the other insulative structures 106 of the stack structure 101 may be removed through the slots 133 as part of a so-called "replacement gate" or "gate last" process. By way of non-limiting example, the other insulative structures 106 may be removed by exposing the other insulative structures 106 to a wet etchant comprising one or more of phosphoric acid, sulfuric acid, hydrochloric acid, nitric acid, or another material. In some embodiments, the other insulative structures 106 are removed by exposing the other insulative structures 106 to a so-called "wet nitride strip" comprising a wet etchant comprising phosphoric acid. In some embodiments, the other insulative structures 106 of the stack structure 101 and of the other stack structure 105 may be removed simultaneously through the slots 133.

Referring to FIG. 1L, after removal of the other insulative structures 106 (FIG. 1J), conductive structures 142 may be formed between the neighboring insulative structures 104 at locations corresponding to the locations of the other insulative structures 106 to form a stack structure 101 comprising tiers 144 of alternating levels of the insulative structures 104 and the conductive structures 142 and another stack structure 105 comprising tiers 144 of alternating levels of the insulative structures 104 and additional conductive structures 145 (which may comprise the same material composition as the conductive structures 142). For clarity, the insulative structures 104 of the other stack structure 105 may be referred to here as additional insulative structures 104. The conductive structures 142 of the stack structure 101 may serve as local word line structures (e.g., local or word line plates). The additional conductive structures 145 of the other stack structure 105 may serve as select gate structures, such as select gate drain (SGD) structures.

The conductive structures 142 and the additional conductive structures 145 may each individually be formed of and include an electrically conductive material, such as at least one electrically conductive material, such as, for example, tungsten, titanium, nickel, platinum, rhodium, ruthenium, iridium, aluminum, copper, molybdenum, silver, gold, a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively-doped semiconductor material (e.g., conductively-doped silicon, conductively-doped germanium, conductively-doped silicon germanium, etc.), polysilicon, other materials exhibiting electrical conductivity, or combinations thereof. In some embodiments, the conductive structures 142 and the additional conductive structures 145 comprise tungsten.

In some embodiments, the conductive structures 142 may include a conductive liner material around the conductive structures 142, such as between the conductive structures 142 and the insulative structures 104. In addition, the additional conductive structures 145 may include a conductive liner material around the additional conductive structures 145, such as between the additional conductive structures 145 and the insulative structures 104. The conductive liner material may comprise, for example, a seed material from which the conductive structures 142 and additional conductive structures 145 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

Formation of the conductive structures 142 may form strings 160 of memory cells 162. The memory cells 162 of the strings 160 may be located at intersections of the pillars 110 and the conductive structures 142, and may individually include a portion of one of the pillar 110 and a portion of one of the conductive structures 142. Vertically neighboring memory cells 162 of the strings 160 may be separated from each other by one of the levels of the insulative structures 104.

After forming the conductive structures 142 and the additional conductive structures, the slot 133 may be filled with a dielectric material 146. The dielectric material 146 may extend through the other stack structure 105 and the stack structure 101. Accordingly, the dielectric material 146 may physically separate neighboring (e.g., adjacent) block structures 140 (FIG. 1K) of the microelectronic device structure 100.

The dielectric material 146 may comprise one or more of the materials described above with reference to the insulative material 112. In some embodiments, the dielectric material 146 comprises substantially the same material composition as the insulative material 112. In some embodiments, the dielectric material 146 comprises silicon dioxide.

With collective reference now to FIG. 1M and FIG. 1N, after filling the slots 133 with the dielectric material 146, additional slots 148 may be formed through the tiers 144 of alternating levels of the insulative structures 104 and the additional conductive structures 145 of the other stack structure 105. In some embodiments, the additional slots 148 are formed by sequentially removing the tiers 144 of the insulative structures 104 and the additional conductive structures 145. FIG. 1M is a simplified partial cross-sectional view of the microelectronic device structure 100 of FIG. 1N taken through section line M-M.

In some embodiments, the additional slots 148 terminate within a lowermost one of the tiers 144 of the other stack structure 105. In some such embodiments, the additional conductive structure 145 of the lowermost tier 144 of the other stack structure 105 may be substantially continuous within the block structure 140 and may be, for example, contiguous with the conductive structures 142 of the stack structure 101. By way of comparison, the additional slots 148 may segment the additional conductive structures 145 of the tiers 144 of the other stack structure 105 (other than the lowermost tier 144) into different portions such that the additional conductive structures 145 are not substantially continuous within the block structure 140. Rather, such additional conductive structures 145 may be segmented by the additional slots 148.

In some embodiments, the lowermost additional conductive structure 145 may comprise a so-called "dummy" word line structure. In use and operation of the microelectronic device structure 100, a voltage may be applied to the lowermost additional conductive structure 145, which may facilitate an improved current flow through the channel material 130 horizontally proximate the lowermost additional conductive structure 145 and through the interdeck region 111. The continuous lowermost additional conductive structure 145 may facilitate application of the voltage proximate substantially all of the first upper pillar structures 135 and the second upper pillar structures 137 within the block structure 140. In addition, in some embodiments, uppermost conductive structures 142 of the stack structure 101 may comprise dummy word line structures. Similarly, application of a voltage to the uppermost conductive structures 142 may facilitate improved flow of current through the channel material 130 proximate the interdeck region 111.

With continued reference to FIG. 1M and FIG. 1N, the additional slots 148 may extend vertically over (e.g., in the Z-direction) at least a portion of each of the pillars 110 neighboring the additional slots 148. The additional slots 148 may be sized and shaped to facilitate electrical isolation of the additional conductive structures 145 and may be physically spaced from the upper pillar structures 135, 137.

The additional slots 148 may exhibit a so-called "weave" pattern wherein the additional slots 148 are not defined by a substantially straight line (e.g., extending in the Y-direction). Rather, the additional slots 148 may be configured to extend between neighboring columns of the pillars 110 and the upper pillar structures 135 and may exhibit a shape to at least partially conform to the layout (e.g., the shape) of the strings 160 of memory cells 162 and the first upper pillar structures 135. For example, the additional slots 148 may include crest region 165 (e.g., convex region) extending in a direction away a horizontally neighboring (e.g., in the X-direction) pillar 110 and upper pillar structures 137 and may include a corresponding valley region 167 (e.g., concave region) horizontally neighboring (e.g., in the X-direction) the crest region 165.

The additional slots 148 may be located between first upper pillar structures 135 that are horizontally offset (e.g., that are not concentric) with corresponding strings 160 of memory cells 162 directly underneath the first upper pillar structures 135 (e.g., the first upper pillar structures 135 formed from the first openings 126 (FIG. 1G)). By forming the first upper pillar structures 135 neighboring (e.g., adjacent to) the additional slots 148, the additional slots 148 may be formed to have a greater horizontal dimension without being located too close or removing portions of the upper pillar structures 135. In addition, the weave pattern of the additional slots 148 and the horizontal offset of the first upper pillar structures 135 may facilitate formation of a block structure 140 having a relatively smaller horizontal dimension between slots 133 compared to conventional microelectronic devices. For example, the additional slots of a conventional microelectronic device may be formed through some (e.g., a column) of upper pillar structures, reducing the total number of upper pillar structures that can be fit within a given horizontal dimension between neighboring slots.

A dimension $D_4$ (e.g., diameter) of an upper portion of the additional slots 148 may be within a range from about 20 nm to about 50 nm, such as from about 20 nm to about 30 nm, from about 30 nm to about 40 nm, or from about 40 nm to about 50 nm. In some embodiments, the dimension $D_4$ is about 35 nm. However, the disclosure is not so limited and the dimension $D_4$ may be different than those described. In some embodiments, the dimension $D_4$ is substantially uniform across a width (e.g., in the X-direction) of the additional slots 148. Accordingly, even though the additional slots 148 exhibit a weave shape with arcuate surfaces, the dimension $D_4$ may be substantially uniform.

With reference to FIG. 1N, in some embodiments, the dimension $D_4$ of the additional slots 148 may be greater than a distance between horizontally neighboring strings 160 of memory cells 162. In some embodiments, the additional slots 148 vertically overlie and are located within horizontal boundaries of underlying strings 160 of memory cells 162.

A dimension $D_5$ (e.g., diameter) of a lower portion of the additional slots 148 may be within a range from about 10 nm to about 40 nm, such as from about 10 nm to about 20 nm, from about 20 nm to about 30 nm, or from about 30 nm to about 40 nm. In some embodiments, the dimension $D_5$ is about 25 nm. However, the disclosure is not so limited and the dimension $D_5$ may be different than those described.

A dimension $D_6$ (e.g., distance) between a horizontal edge of the additional slots 148 and a nearest horizontal edge of the first upper pillar structures 135 may be within a range from about 15 nm to about 55 nm, such as from about 15 nm to about 25 nm, from about 25 nm to about 35 nm, from about 35 nm to about 45 nm, or from about 45 nm to about 55 nm. In some embodiments, the dimension $D_6$ is within a range from about 40 nm to about 45 nm. However, the disclosure is not so limited and the dimension $D_6$ may be different than those described.

With reference to FIG. 1N, the additional slots 148 may segment the block structure 140 into sub-block structures 150, each defined within horizontal boundaries between neighboring additional slots 148.

Referring now to FIG. 1O, after forming the additional slots 148, the additional slots 148 may be filled with a dielectric material 152. The dielectric material 152 may comprise one or more of the materials described above with reference to the dielectric material 146. In some embodiments, the dielectric material 152 comprises substantially the same material composition as the dielectric material 146. In some embodiments, the dielectric material 152 comprises silicon dioxide.

After forming the dielectric material 152 within the additional slots 148, dielectric material 152 located outside of the additional slots 148 may be removed, such as by exposing the microelectronic device structure 100 to a CMP process. An etch stop material 154 may be formed over the microelectronic device structure 100. The etch stop material 154 may comprise one or more of the materials described above with reference to the etch stop material 125. In some embodiments, the etch stop material 154 comprises substantially the same material composition as the etch stop material 125. In some embodiments, the etch stop material 154 comprises a carbon-containing material (e.g., silicon carbon nitride (SiCN)).

With continued reference to FIG. 1O, an opening 156 may be formed through the etch stop material 154 to expose an upper portion of the upper pillar structures 135, such as at least an upper surface of the horizontally extending portions 136 of the channel material 130.

Referring now to FIG. 1P, after forming the openings 156, conductive contacts 158 may be formed over and in electrical communication with the channel material 130. The conductive contacts 158 may be electrically coupled to access lines (e.g., bit lines) configured for selectively coupling to strings 160 of memory cells 162.

The conductive contacts 158 may comprise an electrically conductive material, such as one or more of the materials described above with reference to the conductive structures 142. In some embodiments, the conductive contacts 158 comprise substantially the same material composition as the conductive structures 142. In some embodiments, the conductive contacts 158 comprise tungsten.

As described above, the additional slots 148 and the horizontal offset of the first upper pillar structures 135 may facilitate improved operation of the microelectronic device structure 100. For example, the select gate structures formed from the additional conductive structures 145 may exhibit improved threshold voltage properties compared to conventional microelectronic devices. In addition, since the additional conductive structures 145 are formed through the slots 133 (rather than through the additional slots 148), the additional conductive structures 145 may be formed to exhibit improved electrical properties compared to additional conductive structures 145 of conventional microelectronic device structures. Further, since the additional slots 148 are formed through the other stack structure 105 comprising tiers 144 of the additional conductive structures 145 and the other insulative structures 104 (rather than through a stack structure comprising polysilicon or another sacrificial material, as in conventional microelectronic device structures), the additional conductive structures 145 may exhibit fewer voids (e.g., tungsten voids), resulting in improved electrical conductivity (and a lower electrical resistance) compared to conventional microelectronic device structures.

Although FIG. 1A through FIG. 1P have been described and illustrated as including memory cells 162 having a particular structure and configuration, the disclosure is not so limited. In some embodiments, the memory cells 162 may comprise so-called "MONOS" (metal-oxide-nitride-oxide-semiconductor) memory cells. In additional embodiments, the memory cells 162 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 162 comprise so-called "floating gate" memory cells including floating gates (e.g., metallic floating gates) as charge storage structures. The floating gates may horizontally intervene between central structures of the strings 160 and the conductive structures 142.

In some embodiments, electrical connection of the channel material 114 to the channel material 130 by the conductive material 122 may facilitate improved performance of the microelectronic device structure 100. For example, current flow between the channel material 114 and the channel material 130 may be enhanced by the conductive material 122 since the current may flow along several paths through the conductive material 122 between the channel material 114 and the channel material 130 (due to the size and shape of the conductive material 122). In addition, a concentration of dopants within the conductive material 122 may be controlled to facilitate improved flow of current between the channel material 114 and the channel material 130.

Figure 2:
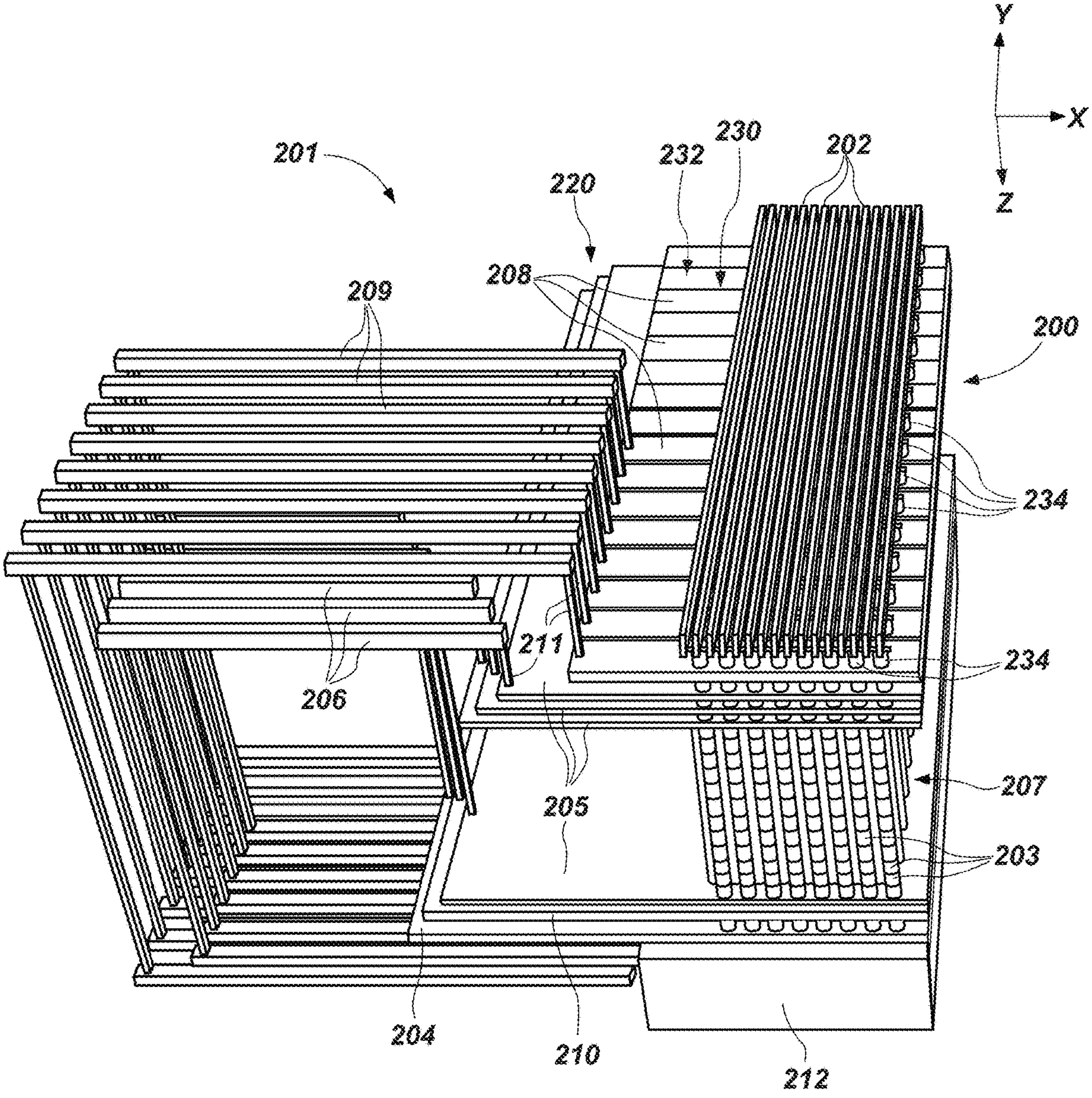
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 following the processing stage previously described with reference to FIG. 1P. As shown in FIG. 2, the microelectronic device structure 200 may include a staircase structure 220 defining contact regions for connecting access lines 206 to conductive tiers 205 (e.g., conductive layers, conductive plates, such as the conductive structures 142 (FIG. 1P)). The microelectronic device structure 200 may include vertical strings 207 (e.g., strings 160 (FIG. 1P)) of memory cells 203 (e.g., memory cells 162 (FIG. 1P)) that are coupled to each other in series. The vertical strings 207 may extend vertically (e.g., in the Z-direction) and orthogonally to conductive lines and tiers 205, such as data lines 202, a source tier 204 (e.g., the source structure 103 (FIG. 1P)), the conductive tiers 205, the access lines 206, first select gates 208 (e.g., upper select gates, drain select gates (SGDs), such as the additional conductive structures 145 (FIG. 1N) of the other stack structure 105 (FIG. 1P)), select lines 209, and a second select gate 210 (e.g., a lower select gate, a source select gate (SGS)). The select gates 208 may be horizontally divided (e.g., in the Y-direction) into multiple blocks 232 (e.g., block structures 140 (FIG. 1N)) horizontally separated (e.g., in the Y-direction) from one another by slots 230 (e.g., the dielectric material 146 (FIG. 1M, FIG. 1N) formed within the replacement gate slot 133 (FIG. 1M, FIG. 1N) and the dielectric material 152 (FIG. 1P) of the additional slots 148 (FIG. 1P)). As described above, with reference to the microelectronic device structure 100, the size, shape, and orientation of the additional slots 148 relative to the first upper pillar structures 135 (FIG. 1P) and the conductive contacts 158 (FIG. 1P) may facilitate formation of first select gates 208 exhibiting a relatively improved properties.

Vertical conductive contacts 211 may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include control logic devices configured to control various operations of other features (e.g., the strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the strings 207 of memory cells 203.

The conductive tiers 205 (e.g., word line plates), such as the conductive structures 142 (FIG. 1P) may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the tiers 205 through the vertical conductive contacts 211. In other words, a particular level of the tiers 205 may be selected via an access line 206 in electrical communication with a respective vertical conductive contact 211 in electrical communication with the particular tier 205.

The data lines 202 may be electrically coupled to the vertical strings 207 through conductive contact structure 234 (e.g., the conductive contacts (FIG. 1P)).

Thus, in accordance with embodiments of the disclosure a microelectronic device comprises a stack structure comprising a vertically alternating sequence of conductive structures and insulative structures arranged in tiers, the stack structure divided into block structures separated from one another by slot structures, strings of memory cells vertically extending through the block structures of the stack structure, the strings of memory cells individually comprising a channel material vertically extending through the stack structure, an additional stack structure vertically overlying the stack structure and comprising a vertical sequence of additional conductive structures and additional insulative structures arranged in additional tiers, first pillars extending through the additional stack structure and vertically overlying the strings of memory cells, each of the first pillars horizontally offset from a center of a corresponding string of memory cells, second pillars extending through the additional stack structure and vertically overlying the strings of memory cells, and additional slot structures comprising a dielectric material extending through at least a portion of the additional stack structure and sub-dividing each of the block structures into sub-block structures, the additional slot structures horizontally neighboring the first pillars.

Thus, in accordance with additional embodiments of the disclosure, a microelectronic device comprises strings of memory cells extending through a first stack structure comprising tiers of alternating conductive structure and insulative structures, the strings of memory cells comprising at least a dielectric material and a channel material vertically extending through the first stack structure, a second stack structure vertically overlying the first stack structure, a first pillar extending through the second stack structure and vertically overlying a first of the strings of memory cells, the first pillar horizontally offset from a center of the first of the strings of memory cells, and a second pillar extending through the second stack structure and vertically overlying a second of the strings of memory cells, the second pillar horizontally aligned with a center of the second of the strings of memory cells.

Thus in accordance with further embodiments of the disclosure, a method of forming a microelectronic device comprises forming a first stack structure comprising alternating levels of insulative structures and other insulative structures, forming strings of memory cells comprising a channel material extending through the first stack structure, forming a second stack structure comprising alternating levels of additional insulative structures and additional other insulative structures over the first stack structure, forming first pillars extending through the second stack structure and over some of the strings of memory cells, a center of each of the first pillars horizontally offset from a center of a corresponding string of memory cells, forming second pillars extending through the stack structure and over others of the strings of memory cells, a center of the each of the second pillars substantially horizontally aligned with a center of a corresponding string of memory cells, and forming a slot structure between neighboring first pillars, the slot structure exhibiting a non-linear shape.

Figure 3:
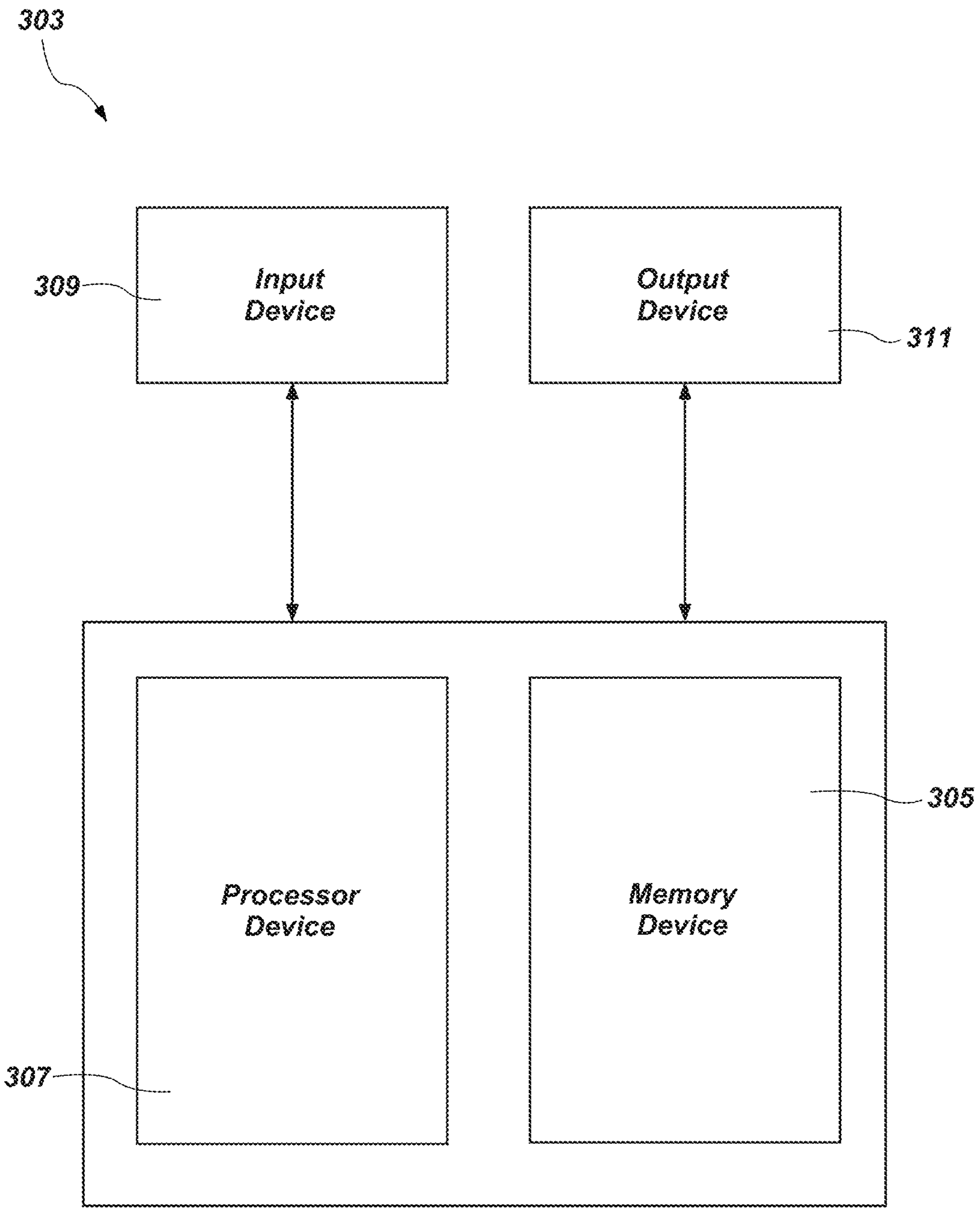
FIG. 3 is a block diagram of an electronic system, in accordance with embodiments of the disclosure.

Microelectronic devices including microelectronic devices (e.g., the microelectronic device 201) and microelectronic device structures (e.g., the microelectronic device structures 100, 200) including the additional slots 148 exhibiting a weave pattern may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein (e.g., the microelectronic device structure 100, 200) or a microelectronic device (e.g., the microelectronic device 201) previously described with reference to FIG. 1A through FIG. 1P and FIG. 2, including the additional slots 148 and the first upper pillar structures 135 and second upper pillar structures 137.

The electronic system 303 may further include at least one electronic signal processor device 307 (often referred to as a "microprocessor"). The electronic signal processor device 307 may, optionally, include an embodiment of a microelectronic device or a microelectronic device structure previously described herein (e.g., one or more of the microelectronic device 201 or the microelectronic device structure 100, 200 previously described with reference to FIG. 1A through FIG. 1P and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
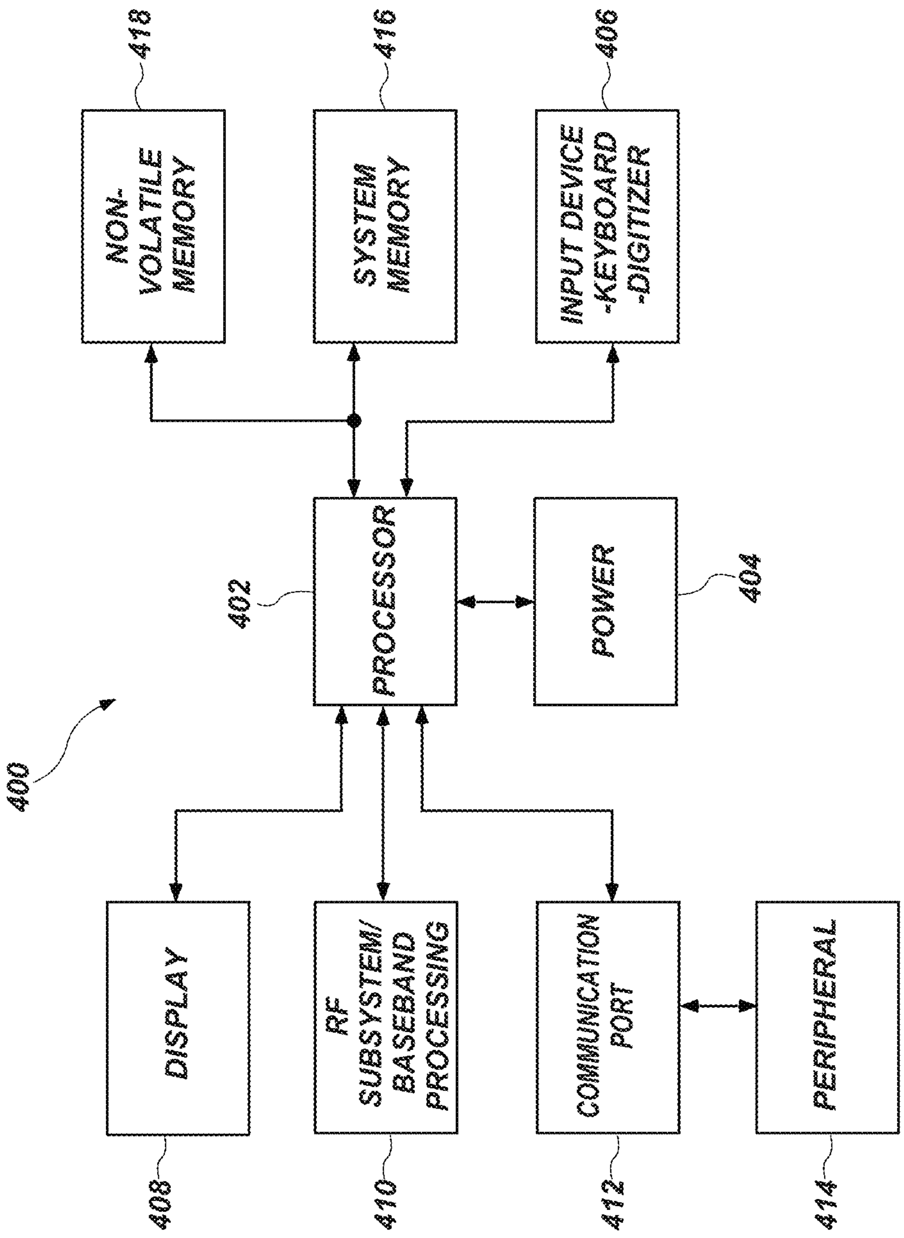
FIG. 4 is a block diagram of a processor-based system, in accordance with embodiments of the disclosure.

With reference to FIG. 4, depicted is a processor-based system 400. The processor-based system 400 may include various microelectronic devices and microelectronic device structures (e.g., microelectronic devices and microelectronic device structures including one or more of the microelectronic device 201 or the microelectronic device structure 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic devices and microelectronic device structures (e.g., microelectronic devices and microelectronic device structures including one or more of the microelectronic device 201 or the microelectronic device structure 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic devices and microelectronic device structures (e.g., the microelectronic device 201 and the microelectronic device structure 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices and microelectronic device structures (e.g., the microelectronic device 201 and the microelectronic device structure 100, 200) described above, or a combination thereof.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises strings of memory cells extending through a stack structure comprising alternating levels of insulative structures and conductive structures, pillars within an additional stack structure comprising alternating levels of additional insulative structures and additional conductive structures, a channel region extending through the stack structure and the strings of memory cells, the channel region having a greater thickness between the stack structure and the additional stack structure than at other portions of the channel region, and slot structures extending at least partially through the stack structure, the slot structures individually exhibiting a non-linear shape.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A memory device, comprising:

blocks horizontally extending in parallel in a first direction and horizontally separated from one another in a second direction orthogonal to the first direction by insulative slot structures, the blocks respectively comprising:

a first deck comprising tiers respectively including conductive material vertically neighboring insulative material;

a second deck vertically overlying the first deck and comprising additional tiers respectively including additional conductive material vertically neighboring additional insulative material; and carbon-containing insulative material vertically between the first deck and the second deck, the carbon-containing insulative material having a different material composition than the additional insulative material;

pillars comprising semiconductor material vertically extending through the first deck of at least one of the blocks;

conductive plugs vertically interposed between the first deck and the carbon-containing insulative material of the at least one of the blocks, the conductive plugs horizontally centered about and in contact with the pillars and respectively comprising at least one sidewall having a non-linear vertical cross-sectional shape exhibiting rounded corners;

additional pillars having smaller horizontal areas than the pillars and comprising additional semiconductor material vertically extending through the second deck and the carbon-containing insulative material of the at least one of the blocks and into the conductive plugs, at least some of the additional pillars individually including a horizontal center offset from a horizontal center of one of the conductive plugs in contact therewith; and additional insulative slot structures vertically extending through the second deck of the at least one of the blocks and respectively horizontally weaving in a non-linear path through rows of the additional pillars horizontally neighboring one another in the second direction.

2. The memory device of claim 1, wherein portions of the at least some of the additional pillars extend beyond horizontal areas of the conductive plugs in contact therewith.

3. The memory device of claim 1, wherein at least some other of the additional pillars individually include a horizontal center substantially aligned with a horizontal center of one of the conductive plugs in contact therewith.

4. The memory device of claim 1, wherein portions of the additional semiconductor material of the additional pillars that vertically overlap the conductive plugs have radiused outer corners.

5. The memory device of claim 1, wherein the additional pillars respectively further comprise:

an insulative liner material horizontally interposed between the additional semiconductor material and sidewalls of the additional tiers of the second deck, a lowermost boundary of the insulative liner material vertically overlying uppermost boundaries of the conductive plugs; and an insulative fill material having side surfaces, a bottom surface, and a top surface each physically contacting and substantially covered by the additional semiconductor material.

6. The memory device of claim 5, wherein the lowermost boundary of the insulative liner material is directly vertically adjacent a horizontally extending surface of the additional semiconductor material, the horizontally extending surface of the additional semiconductor material vertically overlying the uppermost boundaries of the conductive plugs.

7. The memory device of claim 1, wherein the rows of the additional pillars include:

a first row of the additional pillars horizontally neighboring a first non-linear side surface of a respective one of the additional insulative slot structures; and a second row of the additional pillars horizontally neighboring a second non-linear side surface of the respective one of the additional insulative slot structures.

8. The memory device of claim 7, wherein:

a horizontal centerline of the first row of the additional pillars is offset, in the second direction, from a horizontal centerline of a first row of the conductive plugs in contact with the first row of the additional pillars; and a horizontal centerline of the second row of the additional pillars is offset, in the second direction, from a horizontal centerline of a second row of the conductive plugs in contact with the second row of the additional pillars.

9. The memory device of claim 8, wherein each of the additional pillars of the first row of the additional pillars is offset, in the first direction, from each of the additional pillars of the second row of the additional pillars.

10. The memory device of claim 1, wherein the at least one of the blocks respectively includes at least three of the additional insulative slot structures within a horizontal area thereof.

11. A 3D NAND Flash memory device, comprising:

a block vertically overlying a source structure and horizontally interposed between two slot structures that vertically extend to the source structure, the block comprising:

a lower stack structure comprising conductive material vertically alternating with insulative material;

insulative etch stop material vertically overlying the lower stack structure, the insulative etch stop material comprising a carbon-containing material; and an upper stack structure overlying the insulative etch stop material and comprising additional conductive material vertically alternating with additional insulative material, the additional insulative material having a different material composition than the insulative etch stop material;

lower pillar structures vertically extending through the lower stack structure of the block and individually partially defining a string of memory cells within the lower stack structure of the block;

conductive plugs coupled to the lower pillar structures and respectively vertically extending between the lower stack structure and the insulative etch stop material of the block;

upper pillar structures in contact with the conductive plugs and having smaller horizontal areas than the lower pillar structures, the upper pillar structures vertically extending through the upper stack structure and the insulative etch stop material of the block; and additional slot structures partially vertically extending through the upper stack structure of the block, the additional slot structures respectively horizontally extending in a substantially non-linear path between two horizontally neighboring rows of the upper pillar structures, the upper pillar structures of the two horizontally neighboring rows individually including a horizontal center offset from a horizontal center of a respective one of the conductive plugs in contact therewith, each horizontal center of the upper pillar structures of the two horizontally neighboring rows offset in a direction away from a nearest one of the additional slot structures.

12. The 3D NAND Flash memory device of claim 11, wherein the insulative etch stop material of the block comprises a carbon-containing material.

13. The 3D NAND Flash memory device of claim 11, wherein a horizontal center of each upper pillar structure within the two horizontally neighboring rows of the upper pillar structures is offset from a horizontal center of one of the conductive plugs in contact therewith.

14. The 3D NAND Flash memory device of claim 13, wherein horizontal centers of some other of the upper pillar structures outside of the two horizontally neighboring rows of the upper pillar structures are substantially aligned with horizontal centers of the conductive plugs in contact therewith.

15. The 3D NAND Flash memory device of claim 11, wherein: the lower pillar structures respectively comprise:

dielectric blocking material directly horizontally adjacent to the lower stack structure;

memory material horizontally inward of the dielectric blocking material;

tunnel dielectric material horizontally inward of the memory material;

channel material horizontally inward of the tunnel dielectric material; and insulative fill material horizontally inward of the channel material;

the upper pillar structures respectively comprise:

insulative liner material directly horizontally adjacent to the upper stack structure;

additional channel material directly horizontally adjacent to the insulative liner material and in physical contact with a respective one of the conductive plugs; and additional insulative fill material horizontally inward of the additional channel material.

16. The 3D NAND Flash memory device of claim 15, wherein the additional channel material comprises:

a first portion directly horizontally adjacent to inner sidewalls of the insulative liner material;

a second portion continuous with and horizontally extending outward from the first portion, the second portion vertically underlying and in physical contact with a lowermost surface of the insulative liner material; and a third portion continuous with and horizontally extending inward from the first portion, the third portion vertically overlying and in physical contact with an uppermost surface of the additional insulative fill material.

17. The 3D NAND Flash memory device of claim 16, wherein the second portion of the additional channel material has rounded outer corners.

18. The 3D NAND Flash memory device of claim 16, wherein the additional channel material further comprises a fourth portion continuous with and horizontally extending inward from the second portion, the fourth portion vertically underlying and in physical contact with a lowermost surface of the additional insulative fill material.

19. An electronic system, comprising:

a processor device operably coupled to an input device and an output device; and a memory device operably coupled to the processor device and comprising:

blocks horizontally alternating with slot structures, the blocks respectively comprising:

a first deck comprising conductive material vertically alternating with insulative material;

carbon-containing insulative material overlying the first deck; and a second deck overlying the carbon-containing insulative material and comprising additional conductive material vertically alternating with additional insulative material, the additional insulative material having a different material composition than the carbon-containing insulative material;

pillar structures vertically extending through the first deck of at least one of the blocks and respectively partially defining a string of memory cells;

a source structure underlying the blocks and coupled to the pillar structures;

conductive plugs coupled to the pillar structures and vertically extending between the first deck and the carbon-containing insulative material of the at least one of the blocks;

additional pillar structures vertically extending through the second deck and the carbon-containing insulative material of the at least one of the blocks and into the conductive plugs, horizontal centers of some of the additional pillar structures offset from horizontal centers of the conductive plugs in contact therewith; therewith, horizontal centers of others of the additional pillar structures substantially aligned with horizontal centers of the conductive plugs in contact therewith;

additional slot structures partially vertically extending through the second deck of the at least one of the blocks, the additional slot structures respectively horizontally extending a substantially non-linear path between a pair of rows of the additional pillar structures, the some of the addtional pillar structures horizontally neighboring the additional slot structures; and data lines overlying the blocks and coupled to the additional pillar structures.

20. The electronic system of claim 19, wherein each of the additional pillar structures has a smaller horizontal area than each of the pillar structures.

* * * * *